(12) United States Patent
Kuwagata et al.

(10) Patent No.: US 12,577,358 B2
(45) Date of Patent: Mar. 17, 2026

(54) GAS BARRIER FILM AND METHOD OF PRODUCING THE SAME

(71) Applicant: TOPPAN PRINTING CO., LTD.,
Tokyo (JP)

(72) Inventors: Yusuke Kuwagata, Tokyo (JP);
Yasunori Kurauchi, Tokyo (JP);
Toshiaki Yoshihara, Tokyo (JP);
Takafumi Horiike, Tokyo (JP)

(73) Assignee: TOPPAN PRINTING CO., LTD.,
Tokyo (JP)

( * ) Notice: Subject to any disclaimer, the term of this
patent is extended or adjusted under 35
U.S.C. 154(b) by 426 days.

(21) Appl. No.: 16/944,538

(22) Filed: Jul. 31, 2020

(65) Prior Publication Data

US 2020/0361188 A1    Nov. 19, 2020

Related U.S. Application Data

(63) Continuation of application No.
PCT/JP2019/003687, filed on Feb. 1, 2019.

(30) Foreign Application Priority Data

Feb. 2, 2018    (JP) ................................. 2018-017560
Feb. 2, 2018    (JP) ................................. 2018-017575
(Continued)

(51) Int. Cl.
*C08J 7/048*        (2020.01)
*B32B 27/08*        (2006.01)
(Continued)

(52) U.S. Cl.
CPC .............. *C08J 7/048* (2020.01); *B32B 27/08*
(2013.01); *B32B 27/36* (2013.01); *B32B*
*37/025* (2013.01);
(Continued)

(58) Field of Classification Search
None
See application file for complete search history.

(56) References Cited

U.S. PATENT DOCUMENTS

2003/0165696 A1*    9/2003    Namiki ............... C23C 16/0272
428/446
2006/0275926 A1    12/2006    Carcia et al.
(Continued)

FOREIGN PATENT DOCUMENTS

JP        2007-090803 A        4/2007
JP        2007-516347 A        6/2007
(Continued)

OTHER PUBLICATIONS

International Searching Authority, "International Search Report,"
issued in connection with International Patent Application No.
PCT/JP2019/003687, dated May 7, 2019.
(Continued)

*Primary Examiner* — Samir Shah
(74) *Attorney, Agent, or Firm* — Foley & Lardner LLP

(57)        ABSTRACT

A gas barrier film including: a plastic substrate; an atomic
layer deposition film disposed on the plastic substrate; and
an overcoat layer disposed on the atomic layer deposition
film. The overcoat layer contains a thermoplastic resin, and
has a glass transition temperature in a range of 20° C. or
more and 100° C. or less.

9 Claims, 4 Drawing Sheets

(30) Foreign Application Priority Data

| | | | |
|---|---|---|---|
| Apr. 10, 2018 | (JP) | ................................. | 2018-075447 |
| Apr. 10, 2018 | (JP) | ................................. | 2018-075455 |

(51) Int. Cl.

| | |
|---|---|
| B32B 27/36 | (2006.01) |
| B32B 37/00 | (2006.01) |
| C08J 7/04 | (2020.01) |
| C08J 7/043 | (2020.01) |
| C08J 7/046 | (2020.01) |
| C23C 14/10 | (2006.01) |
| C23C 14/35 | (2006.01) |
| C23C 16/40 | (2006.01) |
| C23C 16/455 | (2006.01) |

(52) U.S. Cl.

CPC ............. *C08J 7/0423* (2020.01); *C08J 7/043* (2020.01); *C08J 7/046* (2020.01); *C23C 14/10* (2013.01); *C23C 14/35* (2013.01); *C23C 16/405* (2013.01); *C23C 16/45536* (2013.01); *C23C 16/45553* (2013.01); *B32B 2255/10* (2013.01); *B32B 2255/20* (2013.01); *B32B 2307/536* (2013.01); *B32B 2307/7246* (2013.01); *C08J 2333/08* (2013.01)

(56) References Cited

U.S. PATENT DOCUMENTS

| | | | | |
|---|---|---|---|---|
| 2010/0216905 A1* | 8/2010 | Kuwamura | ........ | C08G 18/6659 528/65 |
| 2012/0208033 A1* | 8/2012 | Weigel | .................... | B32B 7/023 428/447 |
| 2014/0141218 A1* | 5/2014 | Yoshihara | ............. | C23C 16/403 118/729 |
| 2017/0350009 A1* | 12/2017 | Takashima | .............. | B32B 38/18 |

FOREIGN PATENT DOCUMENTS

| | | | | |
|---|---|---|---|---|
| JP | 2008-056835 | A | | 3/2008 |
| JP | 2012-096432 | A | | 5/2012 |
| JP | 2013-082106 | A | | 5/2013 |
| JP | 2013-202949 | A | | 10/2013 |
| JP | 2013202949 | | * | 10/2013 |
| JP | 2015-208885 | A | | 11/2015 |
| JP | 2016-155352 | A | | 9/2016 |
| JP | 2017-047683 | A | | 3/2017 |
| JP | 2017-110142 | A | | 6/2017 |
| WO | WO-2016/136935 | A1 | | 9/2016 |

OTHER PUBLICATIONS

International Searching Authority, "Written Opinion," issued in connection with International Patent Application No. PCT/JP2019/003687, dated May 7, 2019.

Extended European Search Report dated Mar. 2, 2021 for corresponding European Patent Application No. 19747237.6.

Office Action issued in corresponding Japanese Patent Application No. 2019-569619, dated Dec. 20, 2022.

Hampe et al., "The effect of artificial aging on Martens hardness and indentation modulus of different dental CAD/CAM restorative materials", University of Zurich, 2018, pp. 1-32.

Iwatsubo, Satoshi, a technical report "Research into the influence of film characteristics on the wear performance of ceramic films for engine parts", ITC, Publication year 2009, downloaded from http://www.itc.pref.toyama.jp/reserch/detail/field08/thema08-079.html.

Kakio, Takashi, a handout of a lecture "Metal Material Evaluation Using Micro Vickers Hardness Tester and Ultra-Micro Hardness Tester", Shimadzu Corporation, Publication Year 2004, downloaded from https://www.sakaki-tc.or.jp/event/20240612.html.

Liebermann et al., "Effect of storage medium and aging duration on mechanical properties of self-adhesive resin-based cements", J. Appl. Biomater. Funct. Mater., 2017, pp. e1-e9.

* cited by examiner

GAS BARRIER FILM AND METHOD OF PRODUCING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2019/003687, filed on Feb. 1, 2019, which is based upon and claims the benefit of priority to Japanese Patent Application Nos. 2018-017560, filed on Feb. 2, 2018; 2018-017575, filed on Feb. 2, 2018; 2018-075447, filed on Apr. 10, 2018; and, 2018-075455, filed on Apr. 10, 2018. The disclosures of which are all incorporated herein by reference in their entireties.

BACKGROUND

Technical Field

The present invention relates to a gas barrier film and a method of producing the same.

Background Art

In recent years, next-generation devices using organic semiconductor techniques in the fields of organic electroluminescent (EL) displays, organic EL lighting devices, organic solar cells, electronic papers, and the like have been advanced in development, and some have been put to practical use. The elements as the basic constituents of such devices have a precise structure, and are made of material susceptible to external influences. Accordingly, for example, the influence of a small amount or a very small amount of moisture or oxygen may cause deterioration of the structure and material, which may impair the functions of the device. In order to prevent such deterioration of the elements, for example, organic EL displays have a structure in which the elements are sandwiched between glass substrates, since the glass substrates have a high sealing effect for shielding the elements from air, and also have high moisture resistance and light transmittance.

However, considering the difficulty in handling, thickness, and mass of glass, and also an expansion to mobile devices whose markets are rapidly expanding, there is a demand for a flexible (thin, lightweight, unbreakable, bendable) substrate formed of a plastic film. Additionally, such a substrate is required to have gas barrier properties, which prevent deterioration of the structure and material due to exposure to external moisture (water vapor) and oxygen. The requirement for the gas barrier properties is that the water vapor transmission rate should be of the order of $10^{-6}$ [g/(m²·day)], and a thickness, including a substrate film's thickness, should be some tens of micrometers. Transparent gas barrier films that meet these requirements are under investigation.

Such transparent gas barrier films have been developed and put to practical use mainly in the field of packaging materials. Gas barrier films of packages for foods and pharmaceuticals have water vapor barrier properties of the order of 1 to $10^{-2}$ [g/(m²·day)], or better water vapor barrier properties. Flexible gas barrier layers have been developed that conform to a substrate film and achieve high water vapor barrier properties. Such gas barrier layers may be close-packed layers of inorganic materials formed on a thin plastic substrate film, or composite gas barrier layers that include a lamination of inorganic and organic materials to reduce the inorganic material's vulnerability to cracking for example. Such gas barrier layers can be formed using the following methods: Physical Vapor Deposition (PVD) and Chemical Vapor Deposition (CVD). With PVD, a substance is converted to its vapor phase, where it propagates like a gas at the atomic or molecular level, and is then condensed onto a surface of a substrate film.

Examples of PVD include vacuum deposition and sputtering. Sputtering, which provides a high-quality thin film having a uniform quality and thickness, has found widespread use. For example, this method is used in producing transparent electrode wiring films, electrode wiring films, or the like, for displays such as liquid-crystal displays, and a light reflection film or the like of an optical disc.

CVD is a method of growing a solid thin film. When forming a solid thin film using CVD, a raw material gas is introduced into a vacuum chamber, and one or more gases are decomposed or reacted with each other on the substrate with thermal energy. Some types of CVD use a plasma or catalyst reaction to promote the reaction during film formation or reduce the reaction temperature. CVD using a plasma reaction is called plasma-enhanced CVD (PECVD), while CVD using a catalyst reaction is called Cat-CVD. Since deposition defects are reduced when such a CVD method is used, this method is applied, for example, to the process of fabricating semiconductor devices (e.g., the process of forming gate insulating films) or other processes.

Atomic layer deposition (ALD) has attracted attention as a method for achieving higher gas barrier properties. PTL 1 discloses an ALD technique used to deposit a gas transmission barrier layer on a substrate of material selected from the group consisting of plastics and glasses. ALD is a method of depositing layers one by one on a surface of a substrate film at the atomic level through chemical reaction of a substance adsorbed on the surface.

A preferable gas barrier layer is a continuous thin film coating of inorganic material with no defects. However, a substrate film may suffer from defects such as pinholes, due to flaws in the coating process or defects therein which impair its barrier properties. In PTL 1, an organic light-emitting polymer (OLED) is formed on a flexible and permeable polyester substrate, and then a gas barrier layer is formed over the entire top and side surfaces of this light-emitting polymer using ALD. In PTL 1, such a gas barrier layer is used in an optically transparent gas barrier film to reduce the influence of the flaws and defects. Additionally, the gas barrier film of PTL 1 has a thickness of some tens of nanometers so that it can reduce gas permeability drastically compared to conventional gas barrier films.

PTL 2 discloses a gas barrier film that includes at least one inorganic barrier layer and at least one organic layer alternately formed on a plastic substrate. The inorganic barrier layer is formed using ALD. PTL 3 discloses a barrier film having a water vapor transmission rate of $10^{-4}$ [g/(m²·day)] or less. Such a water vapor transmission rate is necessary for barrier films of electronics to prevent elements vulnerable to moisture from deteriorating over a period of time. The barrier film of PTL 3 includes a substrate formed of a plastic film, and first and second barrier layers deposited on a surface and the opposite surface of the substrate using ALD. The first and second barrier layers are formed of inorganic material having water vapor barrier properties.

In ALD, a highly active gas called a precursor (such as Tri-Methyl Aluminum (TMA); hereinafter such a precursor is referred to as a first precursor), and a reactive gas (also called a precursor in ALD and thus hereinafter referred to as a second precursor) are used alternately. Such gases are adsorbed on a surface of a substrate, followed by chemical reaction. In this way, thin layers are grown one by one at the atomic level.

Films are specifically formed through ALD as follows. 1) After a single layer of precursor is adsorbed on a substrate, the unreacted precursors are discharged, as a result of a "self-limiting effect", where after a surface of the substrate is covered by a gas, no further gas is adsorbed on the substrate (first step). 2) A reactive gas is introduced into a chamber to oxidize or reduce the precursor to thereby form one layer of a thin film having a desired composition, followed by discharging the reactive gas (second step). In ALD, this cycle of the first and second steps is repeatedly performed to form thin films on the substrate. Thus, in ALD, thin films grow two-dimensionally. Additionally, ALD has an advantage over conventional vacuum deposition, sputtering, or CVD in that fewer coating defects occur.

Unlike other deposition techniques, ALD does not cause a shadowing effect, where sputtered particles obliquely incident on a surface of a substrate cause unevenness in a formed film. Thus ALD enables film formation as long as there is a gap into which a gas can enter. Therefore ALD is expected to be applied to coating of lines on or holes in a substrate having a high aspect ratio of height to width, or to micro-electro-mechanical systems (MEMS)-related technologies used for coating three-dimensional structures.

ALD may use plasma to activate the reaction in the step of decomposing the second precursor for reaction with the first precursor adsorbed on the substrate. This method is referred to as plasma enhanced ALD (PEALD) or simply plasma ALD.

Examples of substrates on which thin films can be formed using the above-described ALD include small planar substrates, such as wafers and photomasks, inflexible substrates with a large area, such as glass plates, and flexible substrates with a large area, such as film substrates.

Mass production equipment exists for forming thin films on such substrates using ALD. Such equipment can handle various substrates, depending on ease of handling, coating quality, and the like. Examples of such equipment include a single-wafer film deposition apparatus and a batch-type film deposition apparatus. With the single-wafer film deposition apparatus, a single wafer is fed into the apparatus, and a film is formed using ALD, following which the wafer is replaced with the next wafer, which will then be coated. This cycle is repeated. With the batch-type film deposition apparatus, a plurality of wafers are collectively set within the apparatus, and all the wafers are then coated uniformly.

An inline-type film deposition apparatus is used for forming a film on a glass substrate. With this apparatus, film formation is performed while substrates are successively conveyed to a section serving as the source of film formation.

Furthermore, a "roll-to-roll" web coating apparatus is used for forming flexible substrates. With this apparatus, a flexible substrate is unwound from a roll, film formation is performed while the substrate is being conveyed, and the substrate is wound onto another roller.

An atomic layer deposition film formed using ALD is a thin film having a thickness of some nanometers to tens of nanometers, and has high barrier properties which achieve a water vapor transmission rate of the order of $10^{-4}$ [g/(m$^2$·day)] or better, as mentioned above. However, because of its extreme thinness, such an atomic layer deposition film is prone to surface scratches, which may extend down to the substrate; thus, it is known that the gas barrier properties of such films are easily impaired. None of PTLs 1 to 3 describes a gas barrier film that overcomes this vulnerability of the atomic layer deposition film. With regard to this vulnerability, specifically, the atomic layer deposition film suffers from defects when its surface is subjected to mechanical stresses as applied by scratches or external pressures, such as a pressure in its thickness direction or a shearing pressure in a direction parallel to the plane thereof. The defects may lead to formation of a path for atmospheric gases to permeate therethrough and thus to flow between the atomic layer deposition film and the substrate, lowering the gas barrier properties. Further, the adhesion strength between the substrate and the atomic layer deposition film may be lowered.

Additionally, when the roll-to-roll web coating film deposition apparatus is used for forming a film on a plastic substrate, a laminate having an atomic layer deposition film may make contact with a roller while being conveyed, or the atomic layer deposition film may make contact with the plastic substrate, or when the laminate is taken up after film formation, the plastic substrate may make contact with a surface of a different atomic layer deposition film. Further, when the laminate is conveyed and stored around a roll, that is, in a rolled state, or when the laminate is processed into a gas barrier film, the laminate may suffer from defects due to external mechanical stresses, as described above. Accordingly, there remains a risk that the gas barrier properties may be impaired.

It is difficult to configure a film deposition line and a film deposition apparatus so that they are subjected to no mechanical stresses. A major manufacturing problem arises if the laminate cannot be wound, and be conveyed and stored in a rolled state on the film deposition line.

The atomic layer deposition film can be protected from external mechanical stresses by forming a protective film (hereinafter, also referred to as an "overcoat layer") on a surface of the atomic layer deposition film of the laminate using a contact coating method. However, the contact coating method is unfavorable because the laminate may be subjected to mechanical stresses upon contact with, for example, a coating head during coating.

PTL 4 discloses the technique of laminating a specific protective film (overcoat layer) on an atomic layer deposition film in order to suppress or reduce external mechanical stresses on the atomic layer deposition film and prevent deterioration of the adhesion between the plastic substrate and the atomic layer deposition film to thereby prevent deterioration of the gas barrier properties.

[Citation List] [Patent Literature] PTL 1: JP 2007-516347 T; PTL 2: JP 2007-090803 A; PTL 3: JP 2012-096432 A; PTL 4: WO 2016/136935.

SUMMARY OF THE INVENTION

Although the above techniques of laminating an overcoat layer on the barrier layer such as an atomic layer deposition film, a physical vapor deposition film, or a chemical vapor deposition film formed on the plastic substrate contribute to suppression of deterioration of the gas barrier properties, there has been a demand for further improvement.

Therefore, an object of the present invention is to provide a gas barrier film capable of suppressing deterioration of the gas barrier properties with high reliability, and a method of producing the same.

The present inventors have conducted research, and found that an important factor for prevention of deterioration of the gas barrier properties of the gas barrier film that includes the barrier layer formed on the plastic substrate is improvement in the cushioning properties of the overcoat layer to thereby further suppress external mechanical stress on the barrier layer, and enhance adhesion between the overcoat layer and the barrier layer.

In order to solve the above problem, a first embodiment of the present invention includes the following features.

[A1]

A gas barrier film including: a plastic substrate; a barrier layer containing an inorganic substance, the barrier layer being disposed on the plastic substrate; and an overcoat layer disposed on the barrier layer, wherein the overcoat layer contains a thermoplastic resin, and has a glass transition temperature in a range of 20° C. or more and 100° C. or less.

[A2]

The gas barrier film described in [A1], wherein the overcoat layer has Martens hardness of 95 N/mm$^2$ or less.

[A3]

The gas barrier film described in [A1] or [A2], wherein the overcoat layer contains a polyol having two or more hydroxyl groups as the thermoplastic resin.

[A4]

The gas barrier film described in any one of [A1] to [A3], wherein the overcoat layer contains a polyol having a hydroxyl value of 10 mg KOH/g or more and 250 mg KOH/g or less as the thermoplastic resin.

[A5]

The gas barrier film described in any one of [A1] to [A4], wherein the barrier layer is any one of an atomic layer deposition film, a physical vapor deposition film, and a chemical vapor deposition film.

[A6]

A method for producing the gas barrier film described in any one of [A1] to [A5], the method including the steps of: forming the barrier layer on a surface of the plastic substrate by any one of an atomic layer deposition method, a physical vapor deposition method, and a chemical vapor deposition method; forming the overcoat layer on a support; and thermally transferring the overcoat layer from the support onto the barrier layer.

[A7]

The method for producing the gas barrier film described in [A6], wherein the step of forming the barrier layer and the step of thermally transferring the overcoat layer are continuously performed by a roll-to-roll method.

Further, in order to solve the above problem, a second embodiment of the present invention, which is different from the first embodiment, includes the following features.

[B1]

A gas barrier film including: a plastic substrate; a barrier layer containing an inorganic substance, the barrier layer being disposed on the plastic substrate; and an overcoat layer containing an organic polymer resin, the overcoat layer being disposed on the barrier layer, wherein the overcoat layer has Martens hardness of 95 N/mm$^2$ or less.

[B2]

The gas barrier film described in [B1], wherein the overcoat layer contains at least a resin having an OH value in a range of 10 to 100 mg KOH/g as the organic polymer resin.

[B3]

The gas barrier film described in [B1] or [B2], wherein the overcoat layer contains at least a resin having an acid value in a range of 10 to 100 mg KOH/g as the organic polymer resin.

[B4]

The gas barrier film described in any one of [B1] to [B3], wherein the overcoat layer contains at least a thermoplastic resin as the organic polymer resin.

[B5]

The gas barrier film described in any one of [B1] to [B4], wherein the overcoat layer contains at least an ultraviolet curable resin as the organic polymer resin.

[B6]

The gas barrier film described in any one of [B1] to [B5], wherein the overcoat layer has a thickness in a range of 0.1 μm or more and 3.0 μm or less.

[B7]

The gas barrier film described in any one of [B1] to [B6], wherein the barrier layer is any one of an atomic layer deposition film, a physical vapor deposition film, and a chemical vapor deposition film.

[B8]

A method for producing the gas barrier film described in any one of [B1] to [B7], the method including the steps of: forming the barrier layer on a surface of the plastic substrate by any one of an atomic layer deposition method, a physical vapor deposition method, and a chemical vapor deposition method; forming the overcoat layer on a support; and transferring the overcoat layer from the support onto the barrier layer.

[B9]

The method for producing the gas barrier film described in [B8], wherein the step of forming the barrier layer and the step of transferring the overcoat layer are continuously performed by a roll-to-roll method.

Further, the present inventors have conducted research from other viewpoints, and found that an important factor for prevention of deterioration of the gas barrier properties of the gas barrier film that includes the barrier layer formed on the plastic substrate is use of a urethane cross-linked resin in the overcoat layer to thereby further suppress external mechanical stress on the barrier layer, and enhance adhesion between the overcoat layer and the barrier layer.

Therefore, in order to solve the above problem, a third embodiment of the present invention, which is different from the first and second embodiments, includes the following features.

[C1]

A gas barrier film including: a plastic substrate; a barrier layer containing an inorganic substance, the barrier layer being disposed on the plastic substrate; and an overcoat layer disposed on the barrier layer, wherein the overcoat layer contains a urethane cross-linked resin.

[C2]

The gas barrier film described in [C1], wherein the overcoat layer has Martens hardness of 95 N/mm$^2$ or less.

[C3]

The gas barrier film described in [C1] or [C2], wherein the urethane cross-linked resin in the overcoat layer has a caprolactone-modified part.

[C4]

The gas barrier film described in any one of [C1] to [C3], wherein the urethane cross-linked resin in the overcoat layer has an allophanatized part.

[C5]

The gas barrier film described in any one of [C1] to [C4], wherein the overcoat layer has a thickness in a range of 0.1 μm or more and 3.0 μm or less.

[C6]

The gas barrier film described in any one of [C1] to [C5], wherein the barrier layer is any one of an atomic layer deposition film, a physical vapor deposition film, and a chemical vapor deposition film.

[C7]

A method for producing the gas barrier film described in any one of [C1] to [C6], the method including the steps of: forming the barrier layer on a surface of the plastic substrate by any one of an atomic layer deposition method, a physical vapor deposition method, and a chemical vapor deposition method; forming the overcoat layer on a support; and transferring the overcoat layer from the support onto the barrier layer.

[C8]

The method for producing the gas barrier film described in [C7], wherein the step of forming the barrier layer and the step of transferring the overcoat layer are continuously performed by a roll-to-roll method.

Further, the present inventors have conducted research from other viewpoints, and found that it is important for prevention of deterioration of the gas barrier properties of the gas barrier film that includes the barrier layer formed on the plastic substrate to provide an adhesive layer between the overcoat layer laminated on the atomic layer deposition film and the barrier layer to thereby further enhance the cushioning properties, and thus further suppress external mechanical stress on the barrier layer.

Therefore, in order to solve the above problem, a fourth embodiment of the present invention, which is different from the first to third embodiments, includes the following features.

[D1]

A gas barrier film including: a plastic substrate; a barrier layer containing an inorganic substance, the barrier layer being disposed on the plastic substrate; an adhesive layer disposed on the barrier layer; and an overcoat layer disposed on the adhesive layer, wherein the overcoat layer contains a resin composition that is curable by application of heat or ionizing radiation.

[D2]

The gas barrier film described in [D1], wherein the overcoat layer has Martens hardness of 300 $N/mm^2$ or less.

[D3]

The gas barrier film described in [D1] or [D2], wherein the adhesive layer has Martens hardness of 10 $N/mm^2$ or less.

[D4]

The gas barrier film described in any one of [D1] to [D3], wherein the overcoat layer has a thickness in a range of 0.1 μm or more and 3.0 μm or less.

[D5]

The gas barrier film described in any one of [D1] to [D4], wherein the adhesive layer has a thickness in a range of 0.1 μm or more and 3.0 μm or less.

[D6]

The gas barrier film described in any one of [D1] to [D5], wherein the barrier layer is any one of an atomic layer deposition film, a physical vapor deposition film, and a chemical vapor deposition film.

[D7]

A method for producing the gas barrier film described in any one of [D1] to [D6], the method including the steps of: forming the barrier layer on a surface of the plastic substrate by any one of an atomic layer deposition method, a physical vapor deposition method, and a chemical vapor deposition method; forming the overcoat layer and the adhesive layer on a support in this order; and transferring the overcoat layer and the adhesive layer from the support onto the barrier layer.

[D8]

The method for producing the gas barrier film described in [D7], wherein the step of forming the barrier layer and the step of transferring the adhesive layer and the overcoat layer are continuously performed by a roll-to-roll method.

Advantageous Effects of Invention

According to the above aspects of the present invention, a gas barrier film capable of effectively suppressing deterioration of the gas barrier properties, and a method of producing the same can be provided.

DETAILED DESCRIPTION

Figure 1A:
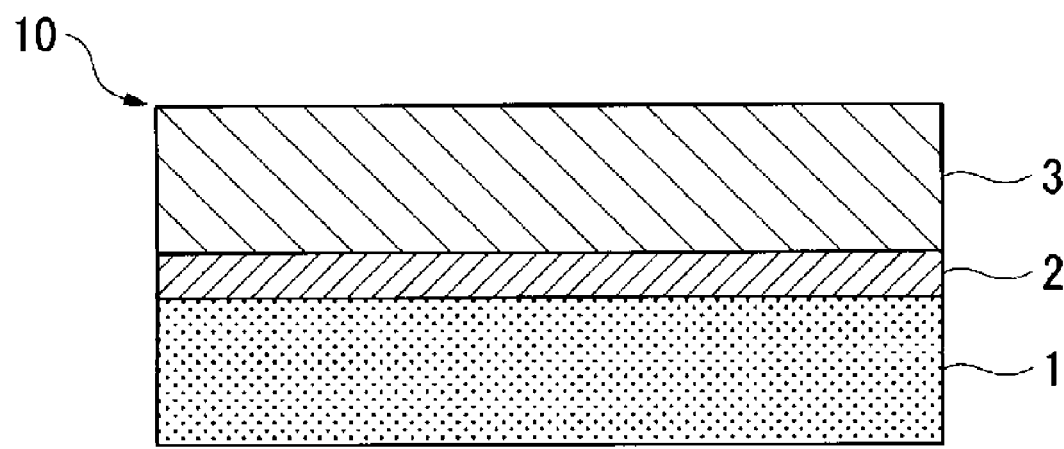
FIG. 1A is a cross-sectional view illustrating a configuration of a gas barrier film according to an embodiment of the present invention.

With reference to the drawings, embodiments of the present invention will be described below. In the following description, the first to fourth embodiments are collectively referred to as "the present embodiment."

The present embodiments explain the gist of the invention and should not limit the interpretation of the following embodiments. It should be understood that the embodiments are merely representative of the present invention. Those skilled in the art can appropriately change the design of the representative embodiments described below.

The drawings are provided for illustrative purposes only, and the dimensions, e.g., the thickness of the layers and the thickness ratios thereof, are not necessarily to scale. Furthermore, the dimensional ratios should not be construed as being limited to those shown in the drawings. Unless otherwise specified for convenience reasons, like components in the embodiments are denoted by like reference signs to omit duplicate description. The embodiments of the present disclosure are a group of embodiments based on a single unique invention from the background. The aspects of the present disclosure are those of the group of embodiments based on a single invention. The configurations described in the present disclosure can include the aspects of the present disclosure. The features of the present disclosure may be combined with each other to achieve the configurations. Therefore, the features, configurations, aspects and embodiments of the present disclosure may be combined with each other, and the combinations can have synergistic functions and exert synergistic effects.

Figure 1B:
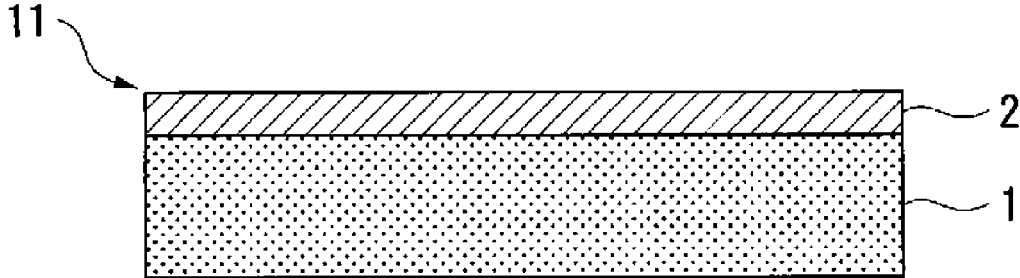
FIG. 1B is a cross-sectional view illustrating a configuration of a gas barrier laminate according to an embodiment of the present invention.
Figure 1C:
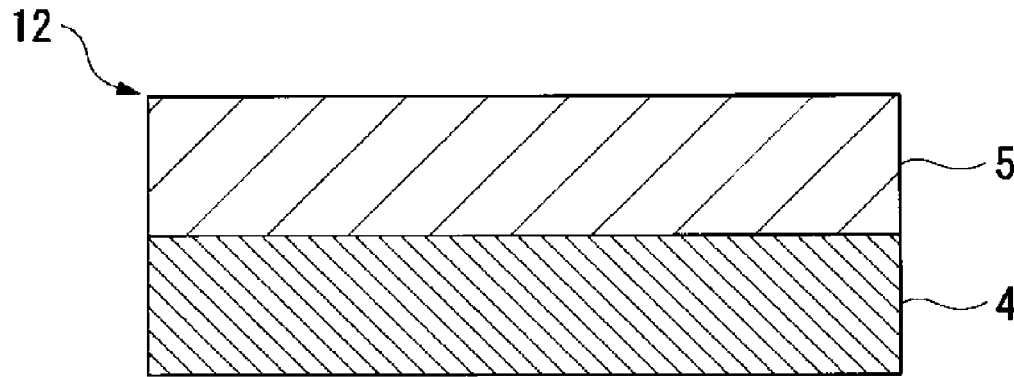
FIG. 1C is a cross-sectional view illustrating a configuration of an overcoat laminate according to an embodiment of the present invention.

As shown in FIG. 1A, a gas barrier film 10 according to the first to third embodiments includes a plastic substrate 1, a barrier layer 2 formed on a first surface of the plastic substrate 1, and an overcoat layer 3 formed on the barrier layer 2. Further, as shown in FIG. 1B, a gas barrier laminate (hereinafter, also referred to as a "first laminate") 11 according to the first to third embodiments includes the plastic substrate 1, and the barrier layer 2 formed on a first surface of the plastic substrate 1. Further, as shown in FIG. 1C, an overcoat laminate (hereinafter, also referred to as a "second laminate") 12 according to the present embodiment includes a support 4, and an overcoat layer 5 formed on the support 4. The overcoat layer 5 in the overcoat laminate 12 is an uncured layer.

Figure 2A:
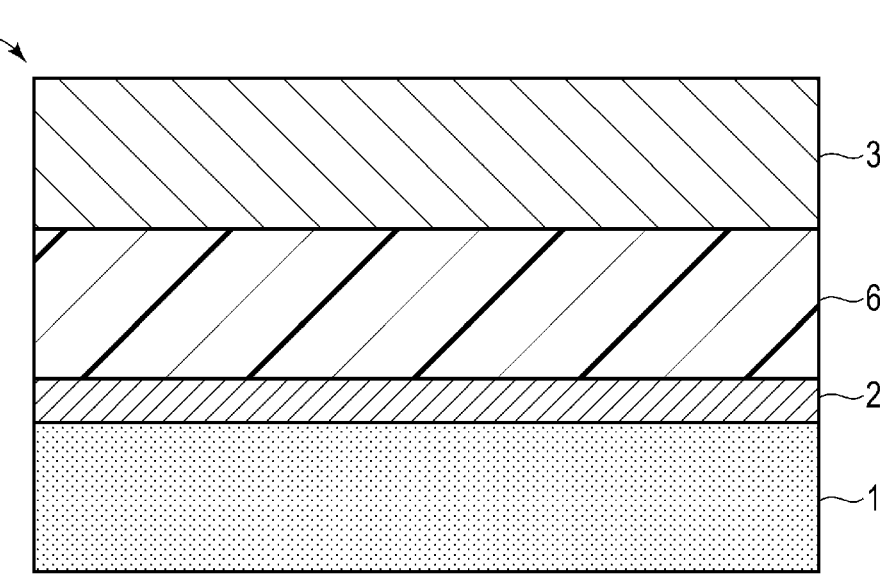
FIG. 2A is a cross-sectional view illustrating a configuration of a gas barrier film according to an embodiment of the present invention.
Figure 2B:
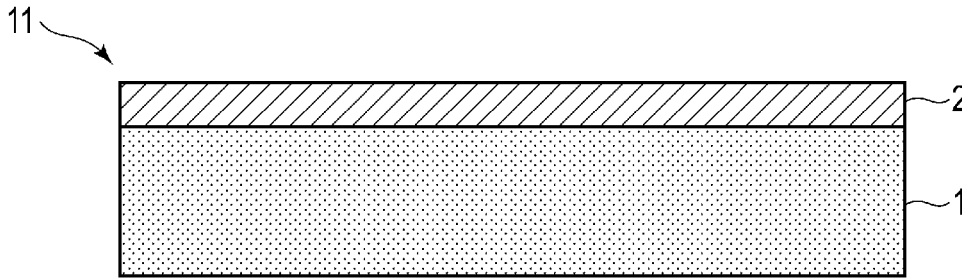
FIG. 2B is a cross-sectional view illustrating a configuration of a gas barrier laminate according to an embodiment of the present invention.
Figure 2C:
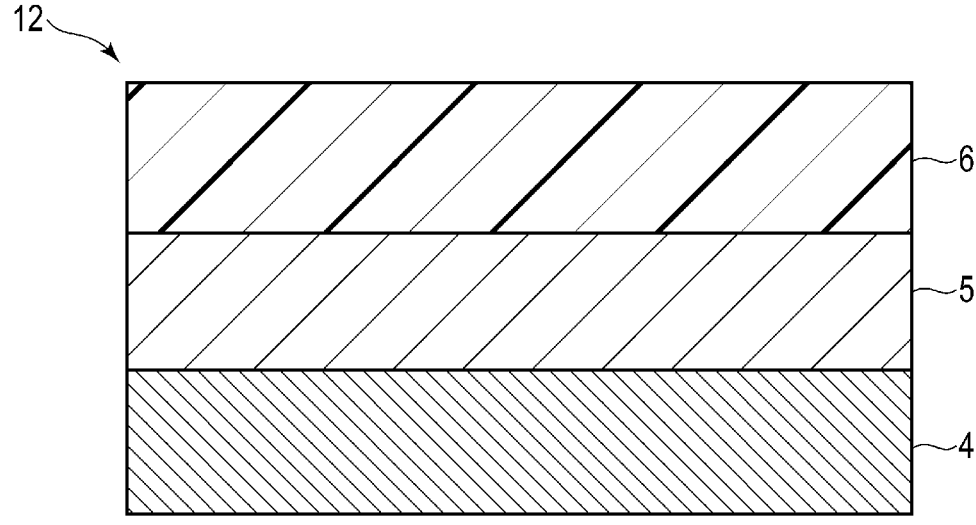
FIG. 2C is a cross-sectional view illustrating a configuration of an overcoat laminate according to an embodiment of the present invention.

As shown in FIG. 2A, a gas barrier film 10 according to the fourth embodiment includes the plastic substrate 1, the barrier layer 2 formed on a first surface of the plastic substrate 1, an adhesive layer 6 formed on the barrier layer 2, and the overcoat layer 3 formed on the adhesive layer 6. Further, as shown in FIG. 2B, the gas barrier laminate (first laminate) 11 according to the fourth embodiment includes the plastic substrate 1, and the barrier layer 2 formed on a first surface of the plastic substrate 1, as with the abovementioned first laminate 11 according to the first to third embodiments. Further, as shown in FIG. 2C, the overcoat laminate (second laminate) 12 according to the fourth embodiment includes the support 4, the overcoat layer 5 formed on the support 4, and the adhesive layer 6 formed on the overcoat layer 5. The overcoat layer 5 in the overcoat laminate 12 is an uncured layer.

<Plastic Substrate>

In the present embodiment, the plastic substrate 1 is formed of a plastic film. Examples of the transparent plastic film usable in the present embodiment include polyester such as polyethylene terephthalate (PET) and polyethylene naphthalate (PEN), polyolefin such as polyethylene (PE) and polypropylene (PP), polyethersulfone (PES), polystyrene (PS), polyamide, polyvinyl chloride (PVC), polyvinyl alcohol (PVA), nylon-6, polycarbonate (PC), polyacrylonitrile, polyimide, aramid, triacetylcellulose (TAC), cyclo olefin polymer (COP), polymethyl methacrylate (PMMA), and biodegradable plastics such as polylactic acid. The plastic film may be stretched or unstretched, and can be used in a web form. Preferably, plastics have high mechanical strength, dimensional stability, and the like.

In particular, biaxially oriented polyethylene terephthalate is preferably used for packaging materials in view of heat resistance and dimensional stability, and polyethylene naphthalate (PEN), polyethersulfone (PES), polycarbonate (PC), and the like are preferably used for flat-panel displays (FPDs) such as liquid-crystal displays (LCDs) and organic EL displays (OLEDs), that require higher heat resistance and dimensional stability.

Further, the plastic substrate 1 may also include additives such as antistatic agents, UV absorbers (UV inhibitors), plasticizers, and lubricants depending on the application. For improved adhesion of the barrier layer to a film formation surface, the surface may be previously subjected to corona treatment, low temperature plasma treatment, ion bombardment, chemical treatment, solvent treatment, or the like.

The plastic substrate of the present embodiment preferably has a thickness of, but not limited to, in the range of 25 μm or more to 200 μm or less in view of the production and processability of the gas barrier film. However, the thickness is not limited to this range. In the case where an atomic layer deposition film is deposited with a roll-to-roll film deposition apparatus for forming an atomic layer deposition film, the plastic substrate 1 is prepared in a rolled state, that is, in the form of a web, where it can be unwound continuously.

<Barrier Layer>

In the present embodiment, the barrier layer 2 is a layer containing an inorganic substance. For example, the barrier layer 2 contains at least one selected from the group consisting of inorganic oxide, inorganic nitride, and inorganic oxynitride. More specifically, the barrier layer 2 may be a film containing an inorganic oxide such as $AlO_X$, $TiO_X$, $SiO_X$, $ZnO_X$, or $SnO_X$, or may be a film containing a nitride or oxynitride of a metal or a non-metal element such as Al, Ti, Si, Zn, or Sn, or may be a film containing an inorganic substance obtained by mixing these elements.

The barrier layer 2 preferably has a thickness in the range of 2 nm or more and 500 nm or less. In particular, when the gas barrier film is used in fields that require high gas barrier properties, such as the fields of organic EL displays, organic EL lighting devices, and organic solar cells, the barrier layer 2 preferably has a thickness of 10 nm or more.

Such a barrier layer 2 may be an atomic layer deposition film formed by an atomic layer deposition (ALD) method, a physical vapor deposition film formed by a physical vapor deposition (PVD) method, or a chemical vapor deposition film formed by a chemical vapor deposition (CVD) method. In one embodiment, the barrier layer 2 is preferably an atomic layer deposition film formed by the ALD method.

(Atomic Layer Deposition Film)

The atomic layer deposition film as the barrier layer 2 is formed by the atomic layer deposition (ALD) method in which a film is formed on the plastic substrate 1. The material to be deposited (target deposition material) is selected according to the application and purpose.

The step of depositing an atomic layer according to the present embodiment is performed by repeating the following steps multiple times: a step of adsorbing a first precursor on a surface of the plastic substrate 1 by an atomic layer deposition method, a step of purging surplus first precursor, a step of exposing the first precursor to a second precursor to allow the first precursor to react with the second precursor, and a step of purging surplus second precursor.

When aluminum oxide ($AlO_x$) is the material to be deposited for forming an atomic layer deposition film, trimethylaluminum (TMA) is used, for example. The material constituting a first precursor to be used is appropriately selected depending on the material to be deposited. For example, titanium tetrachloride ($TiCl_4$) may be used for titanium oxide ($TiO_x$), and tris(dimethylamino)silane (3DMAS), bis(diethylamino)silane (BDEAS), or the like may be used for silicon oxide ($SiO_x$). Further, the material constituting a second precursor is appropriately selected depending on the material to be deposited. For example, when aluminum oxide is the material to be deposited, water, ozone, or atomic oxygen is used. In addition, an inert gas is introduced as a purge gas, which is appropriately selected from nitrogen, helium, argon, and the like.

Figure 5:
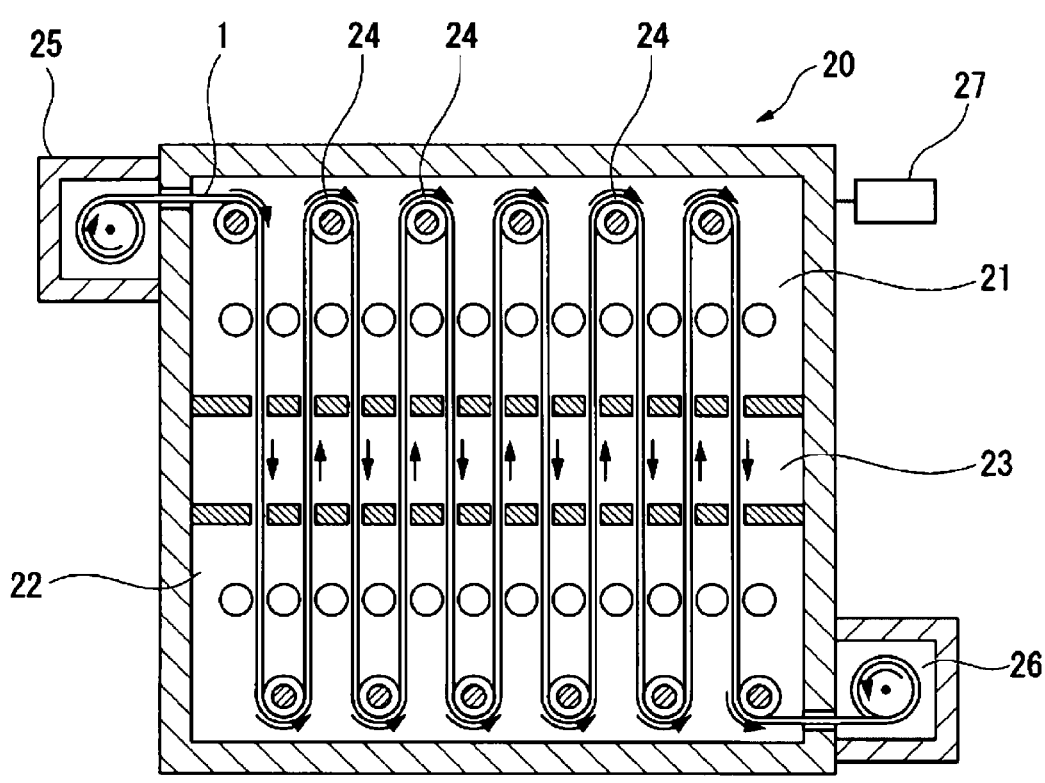
FIG. 5 is a schematic diagram illustrating an example of a film deposition apparatus for forming an atomic layer deposition film using an atomic layer deposition method.

Referring to FIG. 5, which shows a film deposition apparatus 20 for forming an atomic layer deposition film by an atomic layer deposition method, the step of depositing an atomic layer will be described. The film deposition appara-
tus 20 is a winding type film deposition apparatus that
includes a first vacuum chamber 21, a second vacuum
chamber 22, a third vacuum chamber 23, and a transport
mechanism 24. A first precursor gas is introduced into the
first vacuum chamber 21 through a supply port (not shown).
A second precursor gas is introduced into the second
vacuum chamber 22 through a supply port (not shown). A
purge gas is introduced into the third vacuum chamber 23
through a supply port (not shown), which is used for
discharging the first precursor and the second precursor. The
transport mechanism 24 includes a holder and transports the
first plastic substrate 1 to the first vacuum chamber 21, the
second vacuum chamber 22, and the third vacuum chamber
23. The holder holds both ends of the plastic substrate 1 in
the width direction. The film deposition apparatus 20
unwinds the plastic substrate 1 from an unwinding section
25, and forms an atomic layer deposition film on the plastic
substrate 1. A cycle in which the first plastic substrate 1
transported by the transport mechanism 24 passes through
the first vacuum chamber 21 and the second vacuum cham-
ber 22 is defined as one cycle. While the plastic substrate 1
alternately passes through these vacuum chambers multiple
times, an atomic layer is deposited on a surface of the plastic
substrate 1 to thereby form a laminate 11 in which the atomic
layer deposition film 2 is formed. The laminate 11 is taken
up in a roll form by a take-up section 26. The vacuum
chambers 21 to 23 have exhaust ports (not shown) that
communicate with a vacuum pump 27, which is an exhaust
section. The vacuum pump 27 serves to discharge gas from
the vacuum chambers 21 to 23 via the exhaust ports.

By repeating this cycle multiple times, an atomic layer
deposition film of desired thickness is formed on a surface
of the plastic substrate 1. In repetition of the cycle multiple
times, the transport rate of the plastic substrate 1 is set at the
slowest rate among the transport rates calculated from the
time required for exposure of the plastic substrate 1 in each
of the first, second, and third vacuum chambers 21 to 23, and
the distance over which the plastic substrate 1 is transported
to pass through each of the vacuum chambers 21 to 23.
(Physical Vapor Deposition Film)

The physical vapor deposition film as the barrier layer 2
is formed by a physical vapor deposition (PVD) method in
which a film is formed on the plastic substrate 1. PVD is a
method in which a thin film of a target material, for example,
an inorganic substance, is deposited on a surface of a
substance in a gas phase using a physical method. Examples
of the PVD method include sputtering (DC sputtering, RF
sputtering, ion beam sputtering, magnetron sputtering, and
the like), vacuum vapor deposition, and ion plating.

In the sputtering method, a target is placed in a vacuum
chamber, and a rare gas element (typically, argon), which is
ionized by applying a high voltage, is introduced to collide
with the target so that atoms on the surface of the target are
ejected and deposited on the substrate. Here, a reactive
sputtering method may also be used in which a nitrogen gas
or an oxygen gas is introduced into the chamber so that the
elements ejected from the target by argon gas react with
nitrogen or oxygen to form an inorganic layer.
(Chemical Vapor Deposition Film)

The chemical vapor deposition film as the barrier layer 2
is formed by a chemical vapor deposition (CVD) method in
which a film is formed on the plastic substrate 1. CVD is a
method in which a source gas containing a desired thin film
component is supplied onto a substrate so that a film is
deposited by a chemical reaction on the substrate surface or
in a gas phase. Further, in order to activate a chemical reaction, there are methods involving generation of plasma
or the like, which include known CVD methods such as
thermal CVD, catalytic chemical vapor deposition, photo
CVD, vacuum plasma CVD, and atmospheric pressure
plasma CVD. Although not particularly limited, plasma
CVD is preferably used in view of the film formation rate or
processing area. A gas barrier layer obtained by vacuum
plasma CVD or plasma CVD under atmospheric pressure or
near atmospheric pressure is preferable in that a desired
compound can be produced by selecting conditions such as
a metal compound as a raw material, decomposition gas,
decomposition temperature, input power, and the like.
(Overcoat Layer)

Overcoat Layer in First Embodiment

The overcoat layer (OC layer) 3 in the first embodiment
of the present invention contains a thermoplastic resin, and
has a glass transition temperature in a range of 20° C. or
more and 100° C. or less. A glass transition temperature of
20° C. or more is preferred since it prevents the overcoat
layer 3 from having excessively increased adhesiveness so
that solidification after thermal transfer does not become
difficult. Thus, adhesion to the barrier layer 2 can be
enhanced. The glass transition temperature of 100° C. or less
can prevent the temperature required for thermal transfer
from becoming too high, and improve transferability. Fur-
ther, since the overcoat layer 3 has high cushioning prop-
erties without forming a hard film, it is possible to avoid
excessive stress from being applied to the barrier layer 2,
preventing occurrence of defects. The glass transition tem-
perature Tg of the overcoat layer 3 in the first embodiment
is preferably in the range of 25° C. or more and 100° C. or
less, and more preferably in the range of 30° C. or more and
80° C. or less.

The Martens hardness of the overcoat layer 3 of the first
embodiment is not particularly limited, and can be appro-
priately set. In view of cushioning properties, it is preferably
95 N/mm$^2$ or less as described below. When the Martens
hardness is 95 N/mm$^2$ or less, the overcoat layer 3 has
sufficient cushioning properties to absorb the load applied to
the substrate located on the side facing the winding core
when the substrate is wound into a roll. Accordingly, the
mechanical stress applied to the barrier layer 2 on the
substrate surface can be effectively reduced to thereby
prevent deterioration of gas barrier properties. In addition,
when the Martens hardness is 95 N/mm$^2$ or less, the overcoat
layer 3 has good adhesion to the barrier layer 2.

The Martens hardness of the overcoat layer 3 is more
preferably in the range of 1 N/mm$^2$ or more and 95 N/mm$^2$
or less, and even more preferably in the range of 15 N/mm$^2$
or more and 80 N/mm$^2$ or less.

Martens hardness is one of the indicators of the hardness
of a material, and can be measured by a nanoindentation
method. Martens hardness, which is a type of scratch
hardness, is represented by a load required to form a scratch
of 0.01 mm width on a surface of a sample using a pyramid
shaped diamond having an apex angle of 90 degrees.

In the first embodiment, materials constituting the over-
coat layer 3 containing the thermoplastic resin can be
appropriately selected from those capable of thermal trans-
fer, and capable of adjusting the glass transition temperature
of the overcoat layer to 20° C. or more and 100° C. or less.
For example, materials can be appropriately selected from
polyols having two or more hydroxyl groups, such as acrylic
polyols, polyester polyols, polycarbonate polyols, polyether
polyols, polycaprolactone polyols, and epoxy polyols, polyvinyl resins such as polyvinyl acetate and polyvinyl chloride, polyvinylidene chloride resins, polystyrene resins, polyethylene resins, polypropylene resins, polyurethane resins, and the like. Further, these may be mixed in any ratio.

In the first embodiment, the thermoplastic resin contained in the overcoat layer 3 preferably contains a polyol having two or more hydroxyl groups. Having two or more hydroxyl groups increases the adhesion to the barrier layer 2. The content of polyol having two or more hydroxyl groups is not particularly limited, and is appropriately set in view of the adhesion to the barrier layer 2, for example.

In the first embodiment, it is particularly preferred that the overcoat layer 3 includes acrylic polyol as the thermoplastic resin. Examples of the acrylic polyol include a polymer compound obtained by polymerizing (meth)acrylic acid derivative monomers having hydroxyl groups, and a polymer compound obtained by copolymerizing (meth)acrylic acid derivative monomers having hydroxyl groups with other monomers. Examples of the (meth)acrylic acid derivative monomers having hydroxyl groups include hydroxyalkyl (meth)acrylates such as hydroxyethyl (meth)acrylate, and hydroxybutyl (meth)acrylate. The other monomers copolymerizable with (meth)acrylic acid derivative monomers having hydroxyl groups are preferably (meth)acrylic acid derivative monomers having no hydroxyl groups. Examples of the (meth)acrylic acid derivative monomers having no hydroxyl groups include (meth)acrylic acid derivative monomers having alkyl groups, (meth)acrylic acid derivative monomers having carboxyl groups, and (meth)acrylic acid derivative monomers having a ring structure. Examples of the (meth)acrylic acid derivative monomers having alkyl groups include alkyl (meth)acrylates such as methyl (meth)acrylate, ethyl (meth)acrylate, n-butyl (meth)acrylate, and t-butyl (meth)acrylate. Examples of the (meth)acrylic acid derivative monomers having carboxyl groups include (meth)acrylic acid. Examples of the (meth) acrylic acid derivative monomers having a ring structure include benzyl (meth)acrylate, and cyclohexyl (meth)acrylate. Other monomers may be monomers other than (meth) acrylic acid derivative monomers. Examples of such a monomer include styrene monomer, cyclohexylmaleimide monomer, and phenylmaleimide monomer. The above monomers other than (meth)acrylic acid derivative monomers may include hydroxyl groups.

The thermoplastic resin contained in the overcoat layer 3 in the first embodiment preferably has a hydroxyl value in a range of 10 mg KOH/g or more and 250 mg KOH/g or less. The hydroxyl value (mg KOH/g) refers to an index of the hydroxyl group content in a resin, which indicates the quantity in mg of potassium hydroxide required to acetylate the hydroxyl groups in 1 g of resin. A hydroxyl value of 10 mg KOH/g or more is preferred in view of the adhesion to the barrier layer 2. A hydroxyl value of 250 mg KOH/g or less is preferred in view of water resistance. With increase in water resistance, the protective function of the barrier layer 2 is also improved, preventing occurrence of defects.

The weight-average molecular weight of the thermoplastic resin contained in the overcoat layer 3 in the first embodiment is not particularly limited, and is, for example, preferably in a range of 3,000 or more and 200,000 or less, more preferably 5,000 or more and 100,000 or less, and even more preferably 5,000 or more and 40,000 or less. The weight-average molecular weight described herein is a weight-average molecular weight measured by GPC (gel permeation chromatography) with polystyrene as a reference.

The overcoat layer 3 in the first embodiment may further include other components as necessary in addition to the thermoplastic resin. Examples of other components that can be added include curing agents, antioxidants, weather-resistant agents, thermostabilizers, lubricants, nucleating agents, UV absorbers, plasticizers, antistatic agents, colorants, fillers, surfactants, and silane coupling agents.

The content ratio of the thermoplastic resin to the overcoat layer 3 in the first embodiment is not particularly limited, and can be set appropriately. For example, in one embodiment, it can be appropriately set, based on the total mass of the overcoat layer 3, in a range of approximately 10 mass % or more and 100 mass % or less. However, depending on the type of the thermoplastic resin used and other components used in combination, it may also be 10 mass % or less.

The thickness of the overcoat layer 3 in the first embodiment is not particularly limited, and can be appropriately set. In one embodiment, the thickness of the overcoat layer can be appropriately set within a range of 0.1 μm or more and 10.0 μm or less. For example, from the points described below, the thickness is preferably in a range of 0.1 μm or more and 3.0 μm or less. That is, in order to protect the barrier layer 2 from external mechanical stress and prevent deterioration of gas barrier properties, the overcoat layer 3 preferably has a thickness of 0.1 μm or more. Usually, with this thickness, the cushioning properties are reduced and thus the protective function described above deteriorates. However, since the overcoat layer according to the present embodiment has good cushioning properties, the thickness of 0.1 μm or more is sufficient. When the overcoat layer 3 is too thick, excessive stress due to curing shrinkage is applied to the barrier layer 2, which may cause occurrence of defects. Further, when the overcoat layer 3 is too thick, for example, in a structure in which elements of the organic EL display are sandwiched between the gas barrier films 10 is adopted in order to achieve a sealing effect in which air is blocked from reaching the elements and causing deterioration, permeation of water from an end face of the overcoat layer 3 cannot be ignored. Therefore, the thickness of the overcoat layer 3 is preferably 3.0 μm or less.

Figure 3:
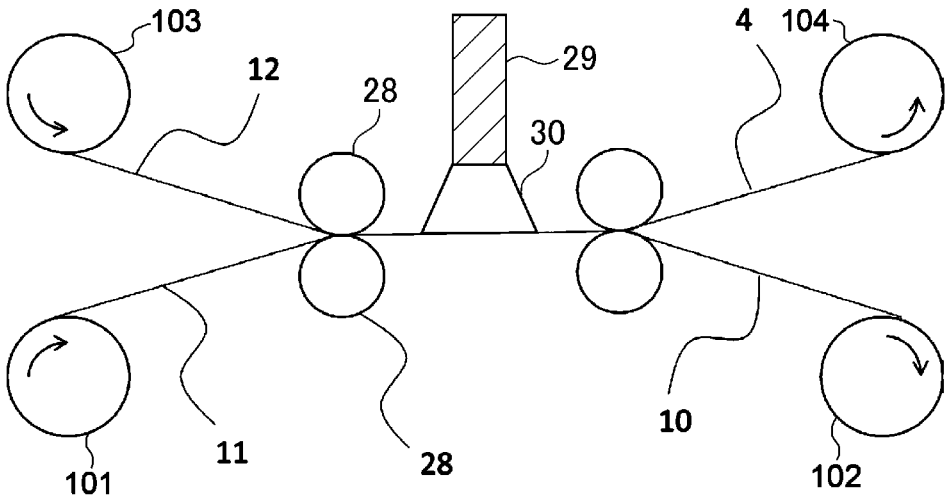
FIG. 3 is a schematic diagram illustrating a step of transferring an overcoat layer included in a method of producing a gas barrier film according to an embodiment of the present invention.

With reference to FIG. 3, an embodiment of the step of transferring the overcoat layer 3 will be described. In FIG. 3, a first laminate 11 unwound from a first unwinding roll 101 and a second laminate 12 unwound from a second unwinding roll 103 are laminated with the barrier layer 2 and the overcoat layer 5 facing each other. The overcoat layer 5 is cured by applying heat from a thermal transfer roll 28 or applying heat 30 generated from a curing processing section 29. Then, the support 4 is peeled off so that the overcoat layer 3 is transferred onto the barrier layer 2. When the overcoat layer 5 is cured by applying heat 30 generated from the curing processing section 29, the roll 28 may not necessarily have a thermal transfer function. The gas barrier film 10 to which the overcoat layer 3 has been transferred is taken up by a first take-up roll 102, and the support 4 that has been peeled off is taken up by a second take-up roll 104.

In another embodiment, the step of depositing the barrier layer 2 onto the plastic substrate 1 and the step of thermally transferring the overcoat layer 3 onto the barrier layer 2 may be continuously performed by a roll-to-roll method. That is, after the barrier layer 2 is deposited on the plastic substrate 1, the overcoat layer 5 may be transferred in-line from the second laminate onto the barrier layer 2. Thus, the gas barrier film can be efficiently produced. In this case, since the transfer step is performed in vacuum, when a solvent is contained in the overcoat layer 5 that has been applied on the support 1, or a solvent remains on the overcoat layer 5, a step of removing the solvent is preferably incorporated in advance.

In another embodiment, the overcoat layer 5 may be formed as a coating film by coating the barrier layer 2 by a known coating method such as spin coating, dipping, die coating, spray coating, or air knife coating, rather than by the transfer method described above.

Overcoat Layer in Second Embodiment

The overcoat layer (OC layer) 3 in the second embodiment of the present invention contains an organic polymer resin, and has a Martens hardness of 95 N/mm$^2$ or less. The technical significance of the overcoat layer having Martens hardness of 95 N/mm$^2$ or less is as described in the above first embodiment, and the more preferable range is the same as that in the first embodiment.

The organic polymer resin contained in the overcoat layer 3 in the second embodiment is preferably an organic polymer resin having at least one of an OH group and a COOH group as a functional group. When the organic polymer resin has an OH group, the OH value is preferably in a range of 10 to 100 mg KOH/g. Further, when the organic polymer resin has a COOH group, the acid value is preferably in a range of 10 to 100 mg KOH/g. The OH value (mg KOH/g) refers to an index of the hydroxyl group content in a resin, which indicates the quantity in mg of potassium hydroxide required to acetylate the hydroxyl groups in 1 g of resin. Further, the acid value (mg KOH/g) refers to the quantity in mg of potassium hydroxide required to neutralize free fatty acids, resin acids, and the like contained in 1 g of a sample. An OH value or acid value of 10 mg KOH/g or more is preferred since the chemical bond between the functional group and the surface of the barrier layer 2 is improved, and thus the adhesion to the barrier layer 2 is improved. An OH value or acid value of 100 mg KOH/g or less is preferred since the precipitate containing the OH group or the COOH group generated by decomposition of the overcoat layer in a durability test such as a moisture and heat resistance test can suppress the tendency of inhibiting adhesion between the overcoat layer and the barrier layer.

The organic polymer resin contained in the overcoat layer 3 in the second embodiment can be appropriately selected from resins capable of adjusting the Martens hardness to 95 N/mm$^2$ or less. For example, one or more selected from thermoplastic resins, thermosetting resins, and ionizing radiation-curable resins can be used. The organic polymer resin is more preferably one that can contribute to improvement in adhesion to the barrier layer.

For example, the thermoplastic resin can be appropriately selected from polyols having two or more hydroxyl groups, such as acrylic polyol, polyester polyol, polycarbonate polyol, polyether polyol, polycaprolactone polyol, and epoxy polyol, polyvinyl resins such as polyvinyl acetate and polyvinyl chloride, polyvinylidene chloride resins, polystyrene resins, polyethylene resins, polypropylene resins, polyurethane resins, and the like. Further, these may be mixed in any ratio.

Examples of the monomer usable for the ultraviolet curable resin include monofunctional monomers and multifunctional monomers such as ethyl(meth)acrylate, ethylhexyl(meth)acrylate, styrene, methylstyrene, N-vinylprrolidone and the like, and, for example, trimethylolpropane (meth) acrylate, hexanediol (meth)acrylate, tripropylene glycol di(meth)acrylate, diethylene glycol (meth)acrylate, pentaerythritol tri(meth)acrylate, dipentaerythritol hexa(meth)

acrylate, 1,6-hexanediol di(meth)acrylate, neopentylglycol (meth)acrylate, and the like. The oligomers usable for the ultraviolet curable resin include urethane acrylate, epoxy acrylate, polyester acrylate, and the like.

In the second embodiment, the overcoat layer 3 preferably includes a thermoplastic resin and an ultraviolet curable resin as the organic polymer resin. By using a thermoplastic resin and an ultraviolet curable resin in combination as the organic polymer resin, the uncured overcoat layer 5 in the second laminate 12 can be adhered to the barrier layer 2 of the first laminate 11 when the uncured overcoat layer 5 is laminated facing the barrier layer 2. Subsequently, after the uncured overcoat layer 5 is cured by ultraviolet radiation, the support 4 is peeled off to transfer the overcoat layer 3 onto the barrier layer 2. Thus, the gas barrier film 10 is obtained.

When a thermoplastic resin and an ultraviolet curable resin are used in combination as the organic polymer resin, the compounding ratio thereof is not particularly limited. That is, in use of a thermoplastic resin and an ultraviolet curable resin in combination, any compounding ratio can be selected as long as the uncured overcoat layer 5 in the second laminate 12 can be adhered to the barrier layer 2 of the first laminate 11 when the uncured overcoat layer 5 is laminated facing the barrier layer 2.

The overcoat layer 3 in the second embodiment may further include other additives as necessary in addition to the organic polymer resin. Examples of the additives include antioxidants, weather-resistant agents, thermostabilizers, lubricants, nucleating agents, UV absorbers, plasticizers, antistatic agents, colorants, fillers, surfactants, and silane coupling agents.

The ratio of the organic polymer resin to the overcoat layer is not particularly limited, and can be appropriately set.

The thickness of the overcoat layer 3 in the second embodiment is not particularly limited, and can be appropriately set. In one embodiment, the thickness of the overcoat layer 3 in the second embodiment is the same as the thickness of the overcoat layer 3 described in the above first embodiment.

Figure 4:
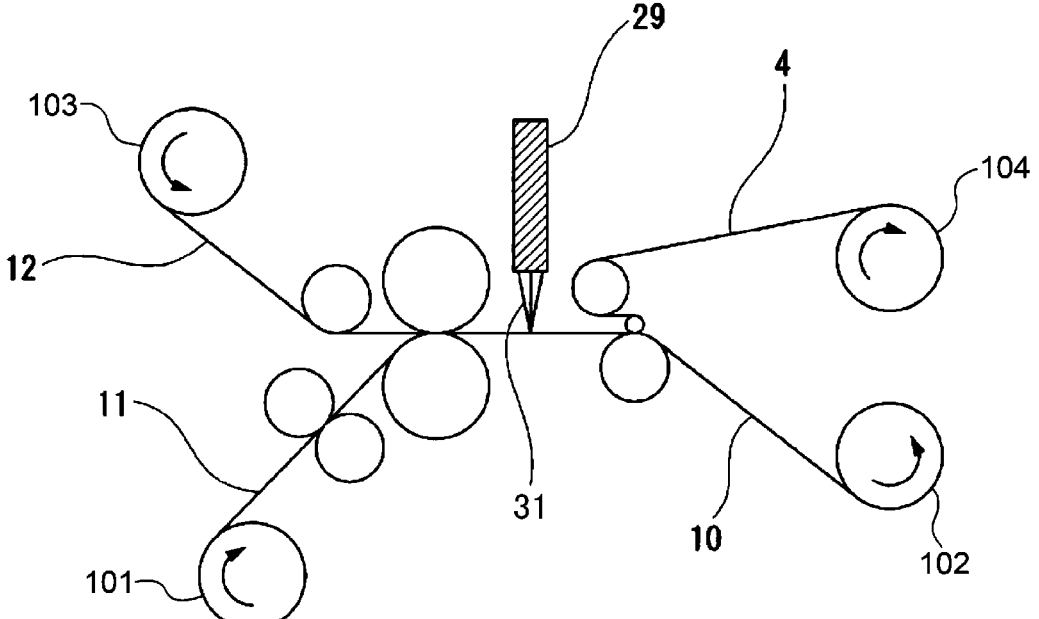
FIG. 4 is a schematic diagram illustrating a step of transferring an overcoat layer included in a method of producing a gas barrier film according to an embodiment of the present invention.

The transfer step of the overcoat layer 3 in the second embodiment is the same as the transfer step of the overcoat layer 3 in the first embodiment described above except that the curing means of the uncured overcoat layer 5 is partially different. That is, as shown in FIG. 4, in the second embodiment, an ionizing radiation 31, instead of heat, may be used as a curing means by the curing processing section 29 depending on the type of the organic polymer resin contained in the overcoat layer.

Further, as with the above first embodiment, the uncured overcoat layer 5 may be formed as a coating film by coating the barrier layer 2 by a known coating method such as spin coating, dipping, die coating, spray coating, or air knife coating, rather than by the transfer method.

Overcoat Layer in Third Embodiment

The overcoat layer (OC layer) 3 in the third embodiment of the present invention contains a urethane cross-linked resin. The urethane cross-linked resin is a cross-linked product obtained by mixing and reacting a polyol as a base resin with a curing agent. The base resin and the curing agent can be appropriately selected. For example, the base resin can be appropriately selected from polyester polyol, polycarbonate polyol, polyether polyol, polycaprolactone polyol, epoxy polyol, acrylic polyol, and the like. As a curing agent, polyisocyanate can be selected. The polyisocyanate may be an adduct form, a biuret form, or an isocyanurate form. The urethane cross-linked resin is a cross-linked product obtained by mixing the base resin and the curing agent with an initiator or a stabilizer as necessary for the cross-linking reaction.

In the third embodiment, the urethane cross-linked resin constituting the overcoat layer 3 preferably contains a caprolactone-modified part. The caprolactone-modified part refers to ε-caprolactone having an open ring structure. By containing the caprolactone-modified part, the film becomes flexible, and the overcoat layer 3 has sufficient cushioning properties to absorb the load applied to the substrate located on the side facing the winding core when the substrate is wound onto a roll. Accordingly, the mechanical stress applied to the barrier layer 2 on the substrate surface can be effectively reduced to thereby prevent deterioration of gas barrier properties. The content of caprolactone-modified part is not particularly limited, and is appropriately set in view of prevention of deterioration of the barrier layer properties, for example.

In the third embodiment, the urethane cross-linked resin constituting the overcoat layer 3 preferably contains an allophanatized part. The allophanatized part refers to a structure having an allophanate bond. By containing the allophanatized part, the film becomes flexible, and the overcoat layer 3 has sufficient cushioning properties to absorb the load applied to the substrate located on the side facing the winding core when the substrate is wound onto a roll. Accordingly, the mechanical stress applied to the barrier layer 2 on the substrate surface can be effectively reduced to thereby prevent deterioration of gas barrier properties. The content of allophanatized part is not particularly limited, and is appropriately set in view of prevention of deterioration of the barrier layer properties, for example.

In the third embodiment, the urethane cross-linked resin constituting the overcoat layer 3 is a cross-linked product obtained by mixing and reacting the base resin and the curing agent, and is preferably a urethane cross-linked resin obtained by using an acryl polyol as the base resin. Examples of the acrylic polyol include a polymer compound obtained by polymerizing (meth)acrylic acid derivative monomers having hydroxyl groups, and a polymer compound obtained by copolymerizing (meth)acrylic acid derivative monomers having hydroxyl groups with other monomers. Examples of the (meth)acrylic acid derivative monomers having hydroxyl groups include hydroxyalkyl (meth)acrylates such as hydroxyethyl (meth)acrylate, and hydroxybutyl (meth)acrylate. The other monomers copolymerizable with (meth)acrylic acid derivative monomers having hydroxyl groups are preferably (meth)acrylic acid derivative monomers having no hydroxyl groups. Examples of the (meth)acrylic acid derivative monomers having no hydroxyl groups include (meth)acrylic acid derivative monomers having alkyl groups, (meth)acrylic acid derivative monomers having carboxyl groups, and (meth)acrylic acid derivative monomers having a ring structure. Examples of the (meth)acrylic acid derivative monomers having alkyl groups include alkyl (meth)acrylates such as methyl (meth) acrylate, ethyl (meth)acrylate, n-butyl (meth)acrylate, and t-butyl (meth)acrylate. Examples of the (meth)acrylic acid derivative monomers having carboxyl groups include (meth) acrylic acid. Examples of the (meth)acrylic acid derivative monomers having a ring structure include benzyl (meth) acrylate, and cyclohexyl (meth)acrylate. Other monomers may be monomers other than (meth)acrylic acid derivative monomers. Examples of such a monomer include styrene monomer, cyclohexylmaleimide monomer, and phenylmaleimide monomer. The above monomers other than (meth) acrylic acid derivative monomers may include hydroxyl groups.

The weight-average molecular weight of the urethane cross-linked resin constituting the overcoat layer 3 in the third embodiment is not particularly limited, and is, for example, preferably in a range of 3,000 or more and 200,000 or less, more preferably 5,000 or more and 100,000 or less, and even more preferably 5,000 or more and 40,000 or less. The weight-average molecular weight described herein is a weight-average molecular weight measured by GPC (gel permeation chromatography) with polystyrene as a reference.

The overcoat layer may further contain resins other than the urethane cross-linked resin, and may contain other additives, as long as the effect of the present invention is not impaired.

The glass transition temperature Tg of the urethane cross-linked resin constituting the overcoat layer 3 in the third embodiment is not particularly limited, and is, for example, preferably in a range of 20° C. or more and 100° C. or less, more preferably 25° C. or more and 100° C. or less, and even more preferably 30° C. or more and 80° C. or less due to the following points. When the glass transition temperature is less than 20° C., the adhesiveness excessively increases, which may hinder solidification after thermal transfer. When the glass transition temperature is higher than 100° C., transfer cannot be performed unless a high temperature is applied. Accordingly, the transferability may be reduced. In addition, since the film becomes hard and the cushioning properties are reduced due to excessively high glass transition temperature, an excessive stress is applied to the barrier layer 2, which may cause a risk of defects.

The overcoat layer (OC layer) 3 in the third embodiment is preferably a film having a Martens hardness of 95 N/mm$^2$ or less. The technical significance of the overcoat layer having Martens hardness of 95 N/mm$^2$ or less is as described in the above first embodiment, and the more preferable range is the same as that in the first embodiment.

The thickness of the overcoat layer 3 in the third embodiment is not particularly limited, and can be appropriately set. In one embodiment, the thickness of the overcoat layer 3 in the third embodiment is the same as the thickness of the overcoat layer 3 described in the above first embodiment.

The transfer step of the overcoat layer 3 in the third embodiment is the same as the transfer step of the overcoat layer 3 in the first embodiment described above.

Further, as with the above first embodiment, the uncured overcoat layer 5 may be formed as a coating film by coating the barrier layer 2 by a known coating method such as spin coating, dipping, die coating, spray coating, or air knife coating, rather than by the transfer method.

Overcoat Layer and Adhesive Layer in Fourth Embodiment

Overcoat Layer

The overcoat layer (OC layer) 3 in the fourth embodiment of the present invention contains a resin composition that is cured by application of heat or ionizing radiation. Since the gas barrier film according to the fourth embodiment includes the adhesive layer 6, which will be described later, the Martens hardness of the overcoat layer 3 may be 300 N/mm$^2$ or less. That is, when the adhesive layer 6 is not provided, and the overcoat layer 3 has a high Martens hardness (for example, higher than 95 N/mm$^2$), the overcoat layer 3 does not have sufficient cushioning properties to absorb the load applied to the substrate located on the side facing the winding core when the substrate is wound into a roll. Accordingly, it is difficult to effectively reduce the mechanical stress applied to the barrier layer on the substrate surface, and to suppress deterioration of gas barrier properties.

However, when the adhesive layer 6 is interposed between the barrier layer 2 and the overcoat layer 3, and the overcoat layer 3 has a Martens hardness of 300 N/mm$^2$ or less, the mechanical stress applied to the barrier layer on the substrate surface can be effectively reduced due to the synergistic effect with cushioning properties of the adhesive layer 6, and deterioration of gas barrier properties can be suppressed.

In order to maximize the above effect of the adhesive layer 6, the Martens hardness of the adhesive layer 6 is preferably 10 N/mm$^2$ or less.

As described above, the overcoat layer 3 contains a resin composition (hereinafter, referred to as a "resin composition") that is cured by application of heat or ionizing radiation. The resin composition contains at least an organic polymer resin. For example, one or more selected from thermoplastic resins, thermosetting resins, and ionizing radiation-curable resins can be used as the organic polymer resin.

For example, the thermoplastic resin can be appropriately selected from polyols having two or more hydroxyl groups, such as acrylic polyol, polyester polyol, polycarbonate polyol, polyether polyol, polycaprolactone polyol, and epoxy polyol, polyvinyl resins such as polyvinyl acetate and polyvinyl chloride, polyvinylidene chloride resins, polystyrene resins, polyethylene resins, polypropylene resins, polyurethane resins, and the like. Further, these may be mixed in any ratio.

The ionizing radiation-curable resin may be, for example, an ultraviolet curable resin. Examples of the monomer usable for the ultraviolet curable resin include monofunctional monomers and multifunctional monomers such as ethyl(meth)acrylate, ethylhexyl(meth)acrylate, styrene, methylstyrene, N-vinylprrolidone and the like, and, for example, trimethylolpropane (meth)acrylate, hexanediol (meth)acrylate, tripropylene glycol di(meth)acrylate, diethylene glycol (meth)acrylate, pentaerythritol tri(meth)acrylate, dipentaerythritol hexa(meth)acrylate, 1,6-hexandiol di(meth)acrylate, neopentylglycol (meth)acrylate, and the like. The oligomers usable for the ultraviolet curable resin include urethane acrylate, epoxy acrylate, polyester acrylate, and the like.

In the fourth embodiment, the overcoat layer 3 preferably includes a thermoplastic resin and an ultraviolet curable resin as the organic polymer resin. When a thermoplastic resin and an ultraviolet curable resin are used in combination as the organic polymer resin, the compounding ratio thereof is not particularly limited, and can be appropriately set.

The overcoat layer 3 in the fourth embodiment may further include an additive as necessary in addition to the organic polymer resin. Examples of the additive include curing agents, antioxidants, weather-resistant agents, thermostabilizers, lubricants, nucleating agents, UV absorbers, plasticizers, antistatic agents, colorants, fillers, surfactants, and silane coupling agents.

The ratio of the organic polymer resin to the overcoat layer is not particularly limited, and can be appropriately set.

The thickness of the overcoat layer 3 in the fourth embodiment is not particularly limited, and can be appropriately set. In one embodiment, the thickness of the overcoat layer 3 in the third embodiment is the same as the thickness of the overcoat layer 3 described in the above first embodiment.

The transfer step of the overcoat layer 3 in the fourth embodiment is the same as the transfer step of the overcoat layer 3 in the second embodiment described above.

Further, as with the above second embodiment, the uncured overcoat layer 5 may be formed as a coating film by coating the barrier layer 2 by a known coating method such as spin coating, dipping, die coating, spray coating, or air knife coating, rather than by the transfer method.

Adhesive Layer

The adhesive layer 6 in the fourth embodiment can be made of known materials, which include, but are not limited to, acrylic, urethane, rubber, fluoro, and silicone-based adhesives.

The thickness of the adhesive layer 6 is not particularly limited, and can be appropriately set. In one embodiment, the thickness of the adhesive layer can be appropriately set within a range of 0.1 μm or more and 10.0 μm or less. For example, from the points described below, the thickness is preferably in a range of 0.1 μm or more and 3.0 μm or less. That is, in order to protect the barrier layer 2 from external mechanical stress and prevent deterioration of gas barrier properties, the adhesive layer 6 preferably has a thickness of 0.1 μm or more. When the adhesive layer 6 is too thick, for example, in a structure in which elements of the organic EL display are sandwiched between the gas barrier films 10 is adopted in order to achieve a sealing effect in which air is prevented from reaching the elements and causing deterioration, permeation of water from an end face of the overcoat layer 6 cannot be ignored. Therefore, the thickness of the adhesive layer 6 is preferably 3.0 μm or less.

<Support>

In the present embodiment, since the uncured overcoat layer 5 is applied and formed on the support 4, the support 4 may have good wettability with the resin, and may be peelable from the overcoat layer 5 which has been transferred onto the barrier layer 2, or from the cured overcoat layer 3. For example, the support 4 may be formed of a plastic film, which includes polyester such as polyethylene terephthalate (PET) or polyethylene naphthalate (PEN), polyolefin such as polyethylene (PE) or polypropylene (PP), polyethersulfone (PES), and the like. In particular, in view of thermal stability and dimensional stability, biaxially stretched polyethylene terephthalate (PET) is preferred.

Further, in order to facilitate peeling from the uncured overcoat layer 5 that has been transferred and laminated on the barrier layer 2 or from the cured overcoat layer 3, an easily peelable layer (not shown) may be provided between the support 4 and the uncured overcoat layer 5. In addition, a surface treatment such as corona treatment or plasma treatment may be applied to a surface of the support 4.

In order to prevent blocking in winding of the overcoat laminate 12, the overcoat laminate 12 may further include an anti-blocking layer (not shown) on a surface of the support 4 on a side opposite to that on which the uncured overcoat layer 5 is applied and formed.

The thickness of the support 4 is preferably in a range of 12 μm or more and 100 μm or less. If the support 4 is too thin, it may have insufficient mechanical strength, leading to a failure in supporting the uncured overcoat layer 5. If the support 4 is too thick, in curing of the uncured overcoat layer 5 while the support 4 is laminated thereon, heat, ultraviolet radiation, or electron beams may be blocked by the support 4 and may not reach the uncured overcoat layer 5. In addition, due to an increased rigidity of the support 4, a strong force is required for peeling the support 4, which may cause poor peelability.

The gas barrier film and the method of producing the gas barrier film according to the present embodiment will be described below by using specific examples and comparative examples. It should be noted that the invention should not be limited to these examples. The examples and comparative examples will be described below.

EXAMPLES

The weight-average molecular weight described below is a weight-average molecular weight measured by GPC (gel permeation chromatography) with polystyrene as a reference.

Example A

Example A1

<Fabrication of Laminate (First Laminate) Having Atomic Layer Deposition Film>

A 50 μm thick polyethylene terephthalate (PET) film was used as a plastic substrate. On the PET film, $TiO_2$ was deposited by an atomic layer deposition method to form a 25 nm thick atomic layer deposition film. In this process, titanium tetrachloride ($TiCl_4$) as a source gas (first precursor), $O_2$ and $N_2$ as a process gas, $N_2$ as a purge gas, and $O_2$ as a reaction gas (second precursor) and a plasma discharge gas were supplied into a vacuum chamber. A plasma excitation power supply at 13.56 MHz was used to perform plasma discharge (250 W) in inductively coupled plasma (ICP) mode to form a laminate (first laminate) having an atomic layer deposition film.

<Fabrication of Overcoat Laminate (Second Laminate)>

A 50 μm thick polyethylene terephthalate (PET) film was used as a support. On the PET film, an easily peelable layer containing silicone was provided. An acrylic polyol having a glass transition temperature of 25° C. and a hydroxyl value of 200 mg KOH/g was diluted with ethyl acetate to prepare a composition for forming an overcoat. The composition for forming an overcoat was applied at a thickness of 2.5 μm on a surface of the easily peelable layer of the support by using a bar coater. This was dried in an oven at 120° C. for 5 minutes to thereby form an overcoat laminate (second laminate) including an overcoat layer having a Martens hardness of 10 N/mm².

The first laminate and the second laminate thus formed were laminated with the atomic layer deposition film and the overcoat layer made of a thermoplastic resin facing each other. A roll heated at 120° C. was applied to both sides of the overcoat layer made of a thermoplastic resin, that is, both the support side and the plastic substrate side, at a speed of 0.5 m/min and a pressure of 0.2 MPa was applied, to perform thermal transfer. Then, the support was peeled off to transfer the overcoat layer onto the atomic layer deposition film. Thus, a gas barrier film having a plastic substrate, an atomic layer deposition film, and an overcoat layer was obtained. The Martens hardness of the overcoat layer was 10 N/mm².

Example A2

A gas barrier film was obtained by the same method as in Example A1 except that an acrylic polyol having a glass transition temperature of 95° C. and a hydroxyl value of 20 mg KOH/g was used as a thermoplastic resin instead of an acrylic polyol used in Example A1. The Martens hardness of the overcoat layer was 90 N/mm².

Example A3

A gas barrier film was obtained by the same method as that of Example A1 except that an acrylic polyol having a glass transition temperature of 60° C. and a hydroxyl value of 50 mg KOH/g was used as a thermoplastic resin instead of the acrylic polyol used in Example A1. The Martens hardness of the overcoat layer was 50 N/mm².

Example A4

<Fabrication of Laminate (First Laminate) Having Atomic Layer Deposition Film>

A first laminate was obtained under the same conditions and by the same method as those of Example A1.

<Fabrication of Overcoat Layer>

The same composition as that prepared in Example A1 was used as a composition for forming an overcoat layer. The composition for forming an overcoat layer was applied on the atomic layer deposition film of the first laminate obtained as above by using a spin coater, and then dried and cured to form an overcoat layer. The Martens hardness of the overcoat layer of the gas barrier film thus formed was 10 N/mm².

Example A5

A gas barrier film was obtained under the same conditions and by the same method as those of Example A1 except that a urethane resin having a glass transition temperature of 25° C. and a hydroxyl value of 5 mg KOH/g was used as a thermoplastic resin instead of an acrylic polyol used in Example A1. The Martens hardness of the overcoat layer was 40 N/mm².

Example A6

A 1st solution and a 2nd solution described below are mixed at a compounding ratio of 60/40 (mass ratio) to prepare a coating solution.

1st solution: Hydrolyzed solution of a solid content of 3 mass % (equivalent to $SiO_2$) obtained by adding 89.6 g of hydrochloric acid (0.1 N) to 10.4 g of tetraethoxysilane, and stirring for 30 minutes for hydrolysis 2nd solution: Solution of 3 mass % of polyvinyl alcohol in a water/isopropyl alcohol solution=90:10 (mass ratio)

A gas barrier film was obtained under the same conditions and by the same method as those of Example A1 except that the first laminate was formed by applying and drying the above coating solution on a film, and then forming a sputtered film by sputtering, instead of the atomic layer deposition film of Example A1.

In the method of forming a sputtered film, a PET film was first set in a chamber of a magnetron sputtering apparatus. 200 sccm of argon gas (Ar) and 30 sccm of oxygen gas ($O_2$) were introduced into the chamber, and a pressure in the chamber was adjusted to 0.2 Pa. A Si target was used as a target, and reactive sputtering was performed at a power density of 3 W/cm².

As a result, a gas barrier film having a plastic substrate, a 90 nm thick sputtered film formed of a silicon oxide film, and an overcoat layer having a Martens hardness of 10 N/mm² was obtained.

Comparative Example A1

A laminate having an atomic layer deposition film on a plastic substrate was formed under the same conditions and by the same method as those of Example A1. A laminate composed of the plastic substrate and the atomic layer deposition film was provided as a gas barrier film.

Comparative Example A2

A gas barrier film was obtained under the same conditions and by the same method as those of Example A1 except that an acrylic polyol having a glass transition temperature of 10° C. and a hydroxyl value of 300 mg KOH/g was used as a thermoplastic resin instead of an acrylic polyol used in Example A1. The Martens hardness of the overcoat layer was 1 N/mm².

Comparative Example A3

A gas barrier film was obtained under the same conditions and by the same method as those of Example A1 except that a urethane resin having a glass transition temperature of 120° C. and a hydroxyl value of 0 mg KOH/g was used as a thermoplastic resin instead of an acrylic polyol used in Example A1. The Martens hardness of the overcoat layer was 150 N/mm².

Comparative Example A4

A gas barrier film was obtained under the same conditions and by the same method as those of Example A6 except that an acrylic polyol having a glass transition temperature of 10° C. and a hydroxyl value of 300 mg KOH/g was used as a thermoplastic resin instead of an acrylic polyol used in Example A6. The Martens hardness of the overcoat layer was 1 N/mm².

<Martens Hardness>

The Martens hardness of the overcoat layer was measured according to ISO14577(−1, −2, and −3). Specifically, the measurement was performed using a nanoindentation system (product name: FischerScope HM2000Xyp) manufactured by Fischer Instruments K.K. A pyramid shaped diamond having a facing angle of 90 degrees was used to measure a load required to form a scratch of 0.01 mm width on a surface of a sample.

<Glass Transition Temperature Tg>

The glass transition temperature of the overcoat layer was measured according to ISO11357-2, using a thermal analyzer (TA7000PC station; manufactured by Hitachi High-Tech Science Corporation).

<Evaluation Method>

[Water Vapor Transmission Rate]

The obtained water vapor transmission rate of each gas barrier film was measured using AQUATRAN (product name) manufactured by MOCON Inc. This value was used as an initial measurement. For a sample equivalent to the sample for which the initial water vapor transmission rate has been measured, a water vapor transmission rate was measured after a compressive stress of 2 MPa was applied in a direction vertical to the planar direction. This value was used as a measurement after compression. Table 1 shows the measurements of the respective water vapor transmission rates.

[Adhesion]

The adhesion of the respective overcoat layers obtained as above was measured according to JIS-K-5600-5-6 cross-cut tape peel test using 100 grid squares. Table 1 shows the results.

TABLE 1

| | | OC layer | | | | | Water vapor transmission rate [g/m² · day] | | Adhesion (cross-cut tape peel using 100 grid squares) |
| | | | Thermoplastic resin | | | | | | |
| | Barrier layer | OC layer formation method | Hydroxyl value (mg KOH/g) | Tg (° C.) | Martens hardness (N/mm²) | Film thickness (μm) | Initial | After compression | |
|---|---|---|---|---|---|---|---|---|---|
| Example A1 | Atomic layer deposition film | Thermal transfer | 200 | 25 | 10 | 2.5 | $5 \times 10^{-4}$ | $6 \times 10^{-4}$ | 100/100: No peeling found |
| Example A2 | Atomic layer deposition film | Thermal transfer | 20 | 95 | 90 | 2.5 | $5 \times 10^{-4}$ | $7 \times 10^{-4}$ | 100/100: No peeling found |
| Example A3 | Atomic layer deposition film | Thermal transfer | 50 | 60 | 50 | 2.5 | $5 \times 10^{-4}$ | $6 \times 10^{-4}$ | 100/100: No peeling found |
| Example A4 | Atomic layer deposition film | Spin coater | 200 | 25 | 10 | 2.5 | $5 \times 10^{-4}$ | $6 \times 10^{-4}$ | 100/100: No peeling found |
| Example A5 | Atomic layer deposition film | Thermal transfer | 5 | 25 | 40 | 2.5 | $5 \times 10^{-4}$ | $6 \times 10^{-4}$ | 80/100: peeling found |
| Example A6 | Sputtered film | Thermal transfer | 200 | 25 | 10 | 2.5 | $4 \times 10^{-3}$ | $5 \times 10^{-3}$ | 100/100: No peeling found |

TABLE 1-continued

| | | | OC layer | | | | | Water vapor transmission rate [g/m² · day] | | Adhesion (cross-cut tape peel using 100 |
| | | | Thermoplastic resin | | | | | | | |
| | Barrier layer | OC layer formation method | Hydroxyl value (mg KOH/g) | Tg (° C.) | Martens hardness (N/mm²) | Film thickness (μm) | Initial | After compression | grid squares) |
|---|---|---|---|---|---|---|---|---|---|
| Comparative example A1 | Atomic layer deposition film | — | — | — | — | — | $5 \times 10^{-4}$ | $3 \times 10^{-1}$ | — |
| Comparative example A2 | Atomic layer deposition film | Thermal transfer | 300 | 10 | 1 | 2.5 | $5 \times 10^{-4}$ | $6 \times 10^{-3}$ | 40/100: Peeling found |
| Comparative example A3 | Atomic layer deposition film | Thermal transfer | 0 | 120 | 150 | 2.5 | $5 \times 10^{-4}$ | $8 \times 10^{-3}$ | 0/100: All peeled |
| Comparative example A4 | Sputtered film | Thermal transfer | 300 | 10 | 1 | 2.5 | $4 \times 10^{-3}$ | $5 \times 10^{-2}$ | 40/100: Peeling found |

As seen from Table 1, for the gas barrier films of Examples A1 to A6, almost no change was found in the water vapor transmission rate even after application of an external mechanical stress compared with immediately after formation of the films. Further, the adhesion of the overcoat layers resulted in no peeling, or peeling within the allowable range, showing good results.

On the other hand, for the gas barrier film of Comparative Example A1, in which no overcoat layer was provided, a greatly increased water vapor transmission rate was found. This shows the vulnerability of the atomic layer deposition film, indicating that the overcoat layer has a function as a protective layer.

For the gas barrier films of Comparative Examples A2, A3, and A4, which use thermoplastic resins having different glass transition temperatures and hydroxyl values, an increase was found in the water vapor transmission rates after compression compared with Examples A1 to A6. Further, the adhesion of the overcoat layers was significantly lowered. This indicates that the overcoat layers have insufficient function as a protective layer.

Example B

Example B1

<Fabrication of Laminate (Gas Barrier Laminate) Having Atomic Layer Deposition Film>

A 50 μm thick polyethylene terephthalate (PET) film was used as a plastic substrate. On the PET film, $TiO_2$ was deposited by an atomic layer deposition method to form a 25 nm thick atomic layer deposition film. In this process, titanium tetrachloride ($TiCl_4$) as a source gas (first precursor), $O_2$ and $N_2$ as a process gas, $O_2$ and $N_2$ as a purge gas, and $O_2$ as a reaction gas (second precursor) and a plasma discharge gas were supplied into a vacuum chamber.

A plasma excitation power supply at 13.56 MHz was used to perform plasma discharge (250 W) in inductively coupled plasma (ICP) mode to form a laminate having an atomic layer deposition film.

<Fabrication of Gas Barrier Film>
Preparation of a Composition for Forming an Overcoat Layer As an organic polymer resin, an acrylic polymer having an OH value of 88 mg KOH/g, a glass transition temperature of 25° C., and a weight-average molecular weight (Mw) of 14,000 (resin (1)), and a polyester acrylate as an ultraviolet curable resin, which was bifunctional and had a glass transition temperature of 29° C. (resin (2)) were mixed at a mass ratio of 50:50. Then, cyclohexanone was added to the mixture to dilute it to a solid content of 24 mass %. Further, IRGACURE 184 (manufactured by BASF) as an initiator was added at 2% of the mass of the above ultraviolet curable resin, and the mixture was stirred to prepare a composition for forming an overcoat layer.

Fabrication of Gas Barrier Film

The composition for forming an overcoat layer obtained as above was applied on the atomic layer deposition film of the laminate described above by using a spin coater to form a 2.5 μm thick coating film. This was dried in an oven at 120° C. for 4 minutes, and then irradiated with ultraviolet radiation of 800 mJ/cm² to form an overcoat layer. Thus, a gas barrier film having a plastic substrate, an atomic layer deposition film, and an overcoat layer having a Martens hardness of 20 N/mm² was obtained.

Example B2

<Fabrication of Laminate (Gas Barrier Laminate) Having Atomic Layer Deposition Film>

A laminate (gas barrier laminate) having an atomic layer deposition film was fabricated in the same manner as in Example B1.

<Fabrication of Gas Barrier Film>
Preparation of a Composition for Forming an Overcoat Layer As an organic polymer resin, an acrylic polymer having an OH value of 88 mg KOH/g, a glass transition temperature of 25° C., and a weight-average molecular weight (Mw) of 14,000 was used. Then, cyclohexanone was added for dilution to a solid content of 24 mass % to thereby prepare a composition for forming an overcoat layer.

Fabrication of Gas Barrier Film

The composition for forming an overcoat layer obtained as above was applied on the atomic layer deposition film of the laminate described above by using a spin coater to form a 2.5 μm thick coating film. This was dried in an oven at 120° C. for 4 minutes to form an overcoat layer. Thus, a gas barrier film having a plastic substrate, an atomic layer deposition film, and an overcoat layer having a Martens hardness of 90 N/mm$^2$ was obtained.

Example B3

<Fabrication of Gas Barrier Laminate (First Laminate)>

A laminate having an atomic layer deposition film was fabricated in the same manner as in Example B1.

<Fabrication of Overcoat Laminate (Second Laminate)>

Preparation of a Composition for Forming an Overcoat Layer

As an organic polymer resin, an acrylic polymer having an OH value of 88 mg KOH/g, a glass transition temperature of 25° C., and a weight-average molecular weight (Mw) of 14,000 (resin (1)), and a polyester acrylate as an ultraviolet curable resin, which was bifunctional and had a glass transition temperature of 29° C. (resin (2)) were mixed at a mass ratio of 50:50. Then, ethyl acetate was added to the mixture to dilute it to a solid content of 20 mass %. Further, IRGACURE 184 (manufactured by BASF) as an initiator was added at 2% of the mass of the above ultraviolet curable resin, and the mixture was stirred to prepare a composition for forming an overcoat layer.

Fabrication of Second Laminate

A commercially available film for release and transfer (peeling force: 0.3 N/25 mm$^2$, thickness 38 μm) was used as a support. The composition for forming an overcoat layer obtained as above was applied at a thickness of 2.5 μm on a surface of the easily peelable layer of the support by using a bar coater. This was dried in an oven at 80° C. for 4 minutes to thereby form an overcoat laminate (second laminate).

<Fabrication of Gas Barrier Film>

The first laminate and the second laminate thus formed were laminated with the atomic layer deposition film and the overcoat layer facing each other. The laminate was irradiated with ultraviolet radiation at 800 mJ/cm$^2$ to cure an overcoat layer. Then, the support was peeled off to transfer the overcoat layer onto the atomic layer deposition film. Thus, a gas barrier film having a plastic substrate, an atomic layer deposition film, and an overcoat layer having a Martens hardness of 20 N/mm$^2$ was obtained.

Example B4

<Fabrication of Laminate (First Laminate) Having Atomic Layer Deposition Film>

A laminate (first laminate) having an atomic layer deposition film was fabricated in the same manner as in Example B1.

<Fabrication of Overcoat Laminate (Second Laminate)>

Preparation of a Composition for Forming an Overcoat Layer

As an organic polymer resin, an acrylic polymer having an OH value of 88 mg KOH/g, a glass transition temperature of 25° C., and a weight-average molecular weight (Mw) of 14,000 (resin (1)), and a polyester acrylate as an ultraviolet curable resin, which was bifunctional and had a glass transition temperature of 29° C. (resin (2)) were mixed at a mass ratio of acrylic polymer:polyester acrylate=65:35.

Then, ethyl acetate was added to the mixture to dilute it to a solid content of 20 mass %. Further, IRGACURE 184 (manufactured by BASF) as an initiator was added at 2% of the mass of the above ultraviolet curable resin, and the mixture was stirred to prepare a composition for forming an overcoat layer.

Fabrication of Second Laminate

A commercially available film for release and transfer (peeling force: 0.3 N/25 mm$^2$, thickness 38 μm) was used as a support. The composition for forming an overcoat layer obtained as above was applied at a thickness of 2.5 μm on a surface of the easily peelable layer of the support by using a bar coater. This was dried in an oven at 80° C. for 4 minutes to thereby form an overcoat laminate (second laminate).

<Fabrication of Gas Barrier Film>

The first laminate and the second laminate thus formed were laminated with the atomic layer deposition film and the overcoat layer facing each other. The laminate was irradiated with ultraviolet radiation of 800 mJ/cm$^2$ to cure an overcoat layer. Then, the support was peeled off. Thus, a gas barrier film having a plastic substrate, an atomic layer deposited film, and an overcoat layer having Martens hardness of 63 N/mm$^2$ was obtained.

Example B5

A 1st solution and a 2nd solution described below are mixed at a compounding ratio of 60/40 (mass ratio) to prepare a coating solution.

1st solution: Hydrolyzed solution of a solid content of 3 mass % (equivalent to SiO$_2$) obtained by adding 89.6 g of hydrochloric acid (0.1 N) to 10.4 g of tetraethoxysilane, and stirring for 30 minutes for hydrolysis 2nd solution: Solution of 3 mass % of polyvinyl alcohol in a water/isopropyl alcohol solution=90:10 (mass ratio)

A gas barrier film was obtained under the same conditions and by the same method as those of Example B1 except that the first laminate was formed by applying and drying the above coating solution on a film, and then forming a sputtered film by sputtering, instead of the atomic layer deposition film of Example B1.

In the method of forming a sputtered film, a PET film was first set in a chamber of a magnetron sputtering apparatus. 200 sccm of argon gas (Ar) and 30 sccm of oxygen gas (O$_2$) were introduced into the chamber, and a pressure in the chamber was adjusted to 0.2 Pa. A Si target was used as a target, and reactive sputtering was performed at a power density of 3 W/cm$^2$.

As a result, a gas barrier film having a plastic substrate, a 90 nm thick sputtered film formed of a silicon oxide film, and an overcoat layer having a Martens hardness of 20 N/mm$^2$ was obtained.

Comparative Example B1

A laminate having an atomic layer deposition film was formed under the same conditions and by the same method as those of Example B 1. A laminate composed of the plastic substrate and the atomic layer deposition film was provided as a gas barrier film.

Comparative Example B2

A gas barrier film having an overcoat layer having Martens hardness of 250 N/mm$^2$ was obtained in the same manner as in Example B1 except that dipentaerythritol hexaacrylate having a glass transition temperature exceeding 250° C. was used as the ultraviolet curable resin (resin (2)) instead of polyester acrylate.

Comparative Example B3

A gas barrier film having an atomic layer deposition film and an overcoat layer having a Martens hardness of 110 N/mm$^2$ was obtained in the same manner as in Example B2 except that polyester urethane resin having an OH value of <1 mg KOH/g, a glass transition temperature of 73° C., and a weight-average molecular weight (Mw) of 25,000 was used as the organic polymer resin.

Gas barrier film having an atomic layer deposited film and an overcoat layer having a Martens hardness of 110 N/mm$^2$

Comparative Example B4

A gas barrier film having an overcoat layer having a Martens hardness of 250 N/mm2 was obtained in the same manner as in Example B5 except that dipentaerythritol hexaacrylate having a glass transition temperature exceeding 250° C. was used as the ultraviolet curable resin (resin (2)) instead of polyester acrylate.

For the respective gas barrier films thus obtained, the Martens hardness, the glass transition temperature Tg, the water vapor transmission rate, and the adhesion were measured in the same manner as in Example A. Table 2 shows the results.

TABLE 2

| | | | OC layer | | | | | | | | Adhesion |
|---|---|---|---|---|---|---|---|---|---|---|---|
| | | | Organic polymer resin | | | | | | | | (cross-cut tape peel |
| | | | Resin (1) (Thermoplastic resin) | | Resin (2) (Ultraviolet curable resin) | | [Mixing ratio] Mass | | | Water vapor transmission rate | |  |
| | | OC layer | Hydroxyl | | Hydroxyl | | ratio of | Martens | Film | [g/m$^2$ · day] | | using |
| | Barrier layer | formation method | value (mg KOH/g) | Tg (° C.) | value (mg KOH/g) | Tg (° C.) | resin (1): resin (2) | hardness (N/mm$^2$) | thickness (μm) | Initial | After compression | 100 grid squares) |
|---|---|---|---|---|---|---|---|---|---|---|---|---|
| Example B1 | Atomic layer deposition film | Spin coater | 88 | 25 | <8 | 29 | 50:50 | 20 | 2.5 | $5 \times 10^{-4}$ | $6 \times 10^{-4}$ | 100/100: No peeling found |
| Example B2 | Atomic layer deposition film | Spin coater | 88 | 25 | — | — | — | 90 | 2.5 | $5 \times 10^{-4}$ | $5 \times 10^{-4}$ | 100/100: No peeling found |
| Example B3 | Atomic layer deposition film | Transfer | 88 | 25 | <8 | 29 | 50:50 | 20 | 2.5 | $5 \times 10^{-4}$ | $7 \times 10^{-4}$ | 100/100: No peeling found |
| Example B4 | Atomic layer deposition film | Transfer | 88 | 25 | <8 | 29 | 65:35 | 63 | 2.5 | $5 \times 10^{-4}$ | $5 \times 10^{-4}$ | 100/100: No peeling found |
| Example B5 | Sputtered film | Spin coater | 88 | 25 | <8 | 29 | 50:50 | 20 | 2.5 | $4 \times 10^{-3}$ | $5 \times 10^{-3}$ | 100/100: No peeling found |
| Comparative example B1 | Atomic layer deposition film | — | — | — | — | — | — | — | — | $5 \times 10^{-4}$ | $3 \times 10^{-1}$ | — |
| Comparative example B2 | Atomic layer deposition film | Spin coater | 88 | 25 | <5 | >250 | 50:50 | 250 | 2.5 | $5 \times 10^{-4}$ | $2 \times 10^{-3}$ | 0/100: All peeled |
| Comparative example B3 | Atomic layer deposition film | Spin coater | <1 | 73 | — | — | — | 110 | 2.5 | $5 \times 10^{-4}$ | $3 \times 10^{-3}$ | 60/100: Peeling found |
| Comparative example B4 | Sputtered film | Spin coater | 88 | 25 | <5 | >250 | 50:50 | 250 | 2.5 | $4 \times 10^{-3}$ | $7 \times 10^{-2}$ | 0/100: All peeled |

As seen from Table 2, for the gas barrier films of Examples B1 to B5, almost no change was found in the water vapor transmission rate even after application of an external mechanical stress compared with immediately after formation of the films. Further, the adhesion of the overcoat layers resulted in no peeling, showing good result.

On the other hand, for the gas barrier film of Comparative Example B1, in which no overcoat layer was provided, a greatly increased water vapor transmission rate was found. This shows the vulnerability of the atomic layer deposition film, indicating that the overcoat layer has a function as a protective layer.

Further, in the samples of Comparative Examples B2 and B4, in which the overcoat layer has Martens hardness of 250 N/mm$^2$, the water vapor transmission rate increased by one order of magnitude. This indicates that the protective function against external mechanical stresses was insufficient due to the overcoat layer having a high Martens hardness. Further, the 100 grid squares were all peeled off, showing that the adhesion was significantly lowered.

Similarly, in Comparative Example B3, the water vapor transmission rate was increased, and the adhesion was decreased. It was found that, with the overcoat layer having a Martens hardness higher than 110 N/mm$^2$, the protective function against external mechanical stresses was insufficient. Further, since the OH value was low as <1, it was found that the chemical bond between the functional group of the overcoat layer and the surface of the atomic layer deposition film was weakened, and the adhesion was reduced.

Example C

Example C1

<Fabrication of Laminate (First Laminate) Having Atomic Layer Deposition Film>

A 50 μm thick polyethylene terephthalate (PET) film was used as a plastic substrate. On the PET film, TiO$_2$ was deposited by an atomic layer deposition method to form a 25 nm thick atomic layer deposition film. In this process, titanium tetrachloride (TiCl$_4$) as a source gas (first precursor), O$_2$ and N$_2$ as a process gas, O$_2$ and N$_2$ as a purge gas, and O$_2$ as a reaction gas (second precursor) and a plasma discharge gas were supplied into a vacuum chamber. A plasma excitation power supply at 13.56 MHz was used to perform plasma discharge (250 W) in inductively coupled plasma (ICP) mode to form a laminate (first laminate) having an atomic layer deposition film.

<Fabrication of Overcoat Laminate (Second Laminate)>

A 50 μm thick polyethylene terephthalate (PET) film was used as a support. On the PET film, an easily peelable layer containing silicone was provided. Acrylic polyol as a base resin and polyisocyanate as a curing agent were mixed and diluted with ethyl acetate to prepare a composition for forming an overcoat, which is composed of a urethane cross-linked resin. The composition for forming an overcoat was applied at a thickness of 2.5 μm on a surface of the easily peelable layer of the support by using a bar coater. This was dried in an oven at 120° C. for 1 minute to thereby form an overcoat laminate (second laminate) having an overcoat layer composed of a urethane cross-linked resin.

The first laminate and the second laminate thus formed were laminated with the atomic layer deposition film and the overcoat layer composed of a urethane cross-linked resin facing each other. A roll heated at 120° C. was applied to both sides of the overcoat layer composed of a urethane cross-linked resin, that is, both the support side and the plastic substrate side, at a speed of 0.5 m/min. and a pressure of 0.2 MPa was applied to perform transfer. Then, the support was peeled off to transfer the overcoat layer onto the atomic layer deposition film. Thus, a gas barrier film having a plastic substrate, an atomic layer deposition film, and an overcoat layer was obtained. The Martens hardness of the overcoat layer was 90 N/mm$^2$.

Example C2

A gas barrier film was obtained in the same manner as in Example C1 except that a urethane cross-linked resin having a caprolactone-modified part was used as the urethane cross-linked resin of the overcoat layer. The Martens hardness of the overcoat layer was 10 N/mm$^2$.

Example C3

A gas barrier film was obtained in the same manner as in Example C1 except that a urethane cross-linked resin having an allophanatized part was used as the urethane cross-linked resin of the overcoat layer. The Martens hardness of the overcoat layer was 20 N/mm$^2$.

Example C4

<Fabrication of Laminate (First Laminate) Having Atomic Layer Deposition Film>

A first laminate was obtained under the same conditions and by the same method as those of Example C1.

<Fabrication of Overcoat Layer>

The same composition as the caprolactone-modified urethane cross-linked resin prepared in Example C2 was used as a composition for forming an overcoat layer. The composition for forming an overcoat layer was applied at a thickness of 2.5 μm on the atomic layer deposition film of the first laminate obtained as above by using a spin coater, and then dried to form an overcoat layer. The Martens hardness of the overcoat layer of the gas barrier film thus formed was 10 N/mm$^2$.

Example C5

A 1st solution and a 2nd solution described below are mixed at a compounding ratio of 60/40 (mass ratio) to prepare a coating solution.

1st solution: Hydrolyzed solution of a solid content of 3 mass % (equivalent to SiO$_2$) obtained by adding 89.6 g of hydrochloric acid (0.1 N) to 10.4 g of tetraethoxysilane, and stirring for 30 minutes for hydrolysis 2nd solution: Solution of 3 mass % of polyvinyl alcohol in a water/isopropyl alcohol solution=90:10 (mass ratio)

A gas barrier film was obtained under the same conditions and by the same method as those of Example C1 except that the first laminate was formed by applying and drying the above coating solution on a film, and then forming a sputtered film by sputtering, instead of the atomic layer deposition film of Example C1.

In the method of forming a sputtered film, a PET film was first set in a chamber of a magnetron sputtering apparatus. 200 sccm of argon gas (Ar) and 30 sccm of oxygen gas (O$_2$) were introduced into the chamber, and a pressure in the chamber was adjusted to 0.2 Pa. A Si target was used as a target, and reactive sputtering was performed at a power density of 3 W/cm$^2$.

As a result, a gas barrier film having a plastic substrate, a 90 nm thick sputtered film formed of a silicon oxide film, and an overcoat layer having Martens hardness of 90 N/mm$^2$ was obtained.

Comparative Example C1

A laminate having an atomic layer deposition film on a plastic substrate was formed under the same conditions and by the same method as those of Example C1. A laminate composed of the plastic substrate and the atomic layer deposition film was provided as a gas barrier film.

Comparative Example C2

A gas barrier film was obtained under the same conditions and by the same method as those of Example C1 except that vinyl chloride-vinyl acetate copolymer resin was used as the overcoat layer instead of the urethane cross-linked resin. The Martens hardness of the overcoat layer was 150 N/mm$^2$.

Comparative Example C3

A gas barrier film was obtained under the same conditions and by the same method as those of Example C5 except that vinyl chloride-vinyl acetate copolymer resin was used as the overcoat layer instead of the urethane cross-linked resin. The Martens hardness of the overcoat layer was 150 N/mm$^2$.

For the respective gas barrier films thus obtained, the Martens hardness, the water vapor transmission rate, and the adhesion were measured in the same manner as in Example A. Table 3 shows the results.

As seen from Table 3, for the gas barrier films of Examples C1 to C5, no significant change was found in the water vapor transmission rate even after application of an external mechanical stress compared with immediately after formation of the films. Further, the adhesion of the overcoat layers resulted in no peeling, showing good result.

On the other hand, for the gas barrier film of Comparative Example C1, in which no overcoat layer was provided, an extremely increased water vapor transmission rate was found. This shows the vulnerability of the atomic layer deposition film, indicating that the overcoat layer has a function as a protective layer.

For the gas barrier films of Comparative Examples C2 and C3, which use resins different from a urethane cross-linked resin, an increase was found in the water vapor transmission rates after compression compared with Examples C1 to C5. Further, the adhesion of the overcoat layers was significantly lowered. This indicates that the overcoat layers have insufficient function as a protective layer.

Example D

Example D1

<Fabrication of Laminate (Gas Barrier Laminate) Having Atomic Layer Deposition Film>

A 50 μm thick polyethylene terephthalate (PET) film was used as a plastic substrate. On the PET film, TiO$_2$ was deposited by an atomic layer deposition method to form a 25 nm thick atomic layer deposition film. In this process, titanium tetrachloride (TiCl$_4$) as a source gas (first precursor), O$_2$ and N$_2$ as a process gas, O$_2$ and N$_2$ as a purge gas, and O$_2$ as a reaction gas (second precursor) and a plasma discharge gas were supplied into a vacuum chamber.

TABLE 3

| | | OC layer | | | | Water vapor transmission rate | | Adhesion (cross-cut tape peel |
|---|---|---|---|---|---|---|---|---|
| | | OC layer | | Martens | Film | (g/m$^2$ · day) | | using |
| | Barrier layer | formation method | Resin | hardness (N/mm$^2$) | thickness (μm) | Initial | After compression | 100 grid squares) |
| Example C1 | Atomic layer deposition film | Thermal transfer | Urethane cross-linked resin | 90 | 2.5 | $5 \times 10^{-4}$ | $8 \times 10^{-4}$ | 100/100: No peeling found |
| Example C2 | Atomic layer deposition film | Thermal transfer | Caprolactone-modified urethane cross-linked resin | 10 | 2.5 | $5 \times 10^{-4}$ | $6 \times 10^{-4}$ | 100/100: No peeling found |
| Example C3 | Atomic layer deposition film | Thermal transfer | Allophanatized urethane cross-linked resin | 20 | 2.5 | $5 \times 10^{-4}$ | $7 \times 10^{-4}$ | 100/100: No peeling found |
| Example C4 | Atomic layer deposition film | Spin coater | Caprolactone-modified urethane cross-linked resin | 10 | 2.5 | $5 \times 10^{-4}$ | $6 \times 10^{-4}$ | 100/100: No peeling found |
| Example C5 | Sputtered film | Thermal transfer | Urethane cross-linked resin | 90 | 2.5 | $4 \times 10^{-3}$ | $5 \times 10^{-3}$ | 100/100: No peeling found |
| Comparative example C1 | Atomic layer deposition film | — | — | — | — | $5 \times 10^{-4}$ | $3 \times 10^{-1}$ | — |
| Comparative example C2 | Atomic layer deposition film | Thermal transfer | Vinyl chloride-vinyl acetate copolymer resin | 150 | 2.5 | $5 \times 10^{-4}$ | $3 \times 10^{-3}$ | 0/100: All peeled |
| Comparative example C3 | Sputtered film | Thermal transfer | Vinyl chloride-vinyl acetate copolymer resin | 150 | 2.5 | $4 \times 10^{-3}$ | $7 \times 10^{-2}$ | 0/100: All peeled |

A plasma excitation power supply at 13.56 MHz was used to perform plasma discharge (250 W) in inductively coupled plasma (ICP) mode to form a laminate having an atomic layer deposition film.

<Fabrication of Gas Barrier Film>

Preparation of a Composition for Forming an Overcoat Layer

As an organic polymer resin, an acrylic polymer having an OH value of 88 mg KOH/g, a glass transition temperature of 25° C., and a weight-average molecular weight (Mw) of 14,000 (thermoplastic resin), and a urethane acrylate as an ultraviolet curable resin, which was multifunctional and had a glass transition temperature of 250° C. were mixed at a mass ratio of 50:50. Then, ethyl acetate was added to the mixture to dilute it to a solid content of 24 mass %. Further, IRGACURE 184 (manufactured by BASF) as an initiator was added at 2% of the mass of the above ultraviolet curable resin, and the mixture was stirred to prepare a composition for forming an overcoat layer.

Preparation of Composition for Forming Adhesive Layer

As an adhesive layer, an addition cure type silicone adhesive having an adhesive force (paste thickness) of 8.7 N/25 mm (30 μm) was diluted with toluene to a solid content of 30 mass %. Further, a platinum catalyst of 0.5% of the mass of the adhesive was added and stirred to prepare a composition for forming an adhesive layer.

Fabrication of Gas Barrier Film

The composition for forming an adhesive layer obtained as above was applied on the atomic layer deposition film of the laminate described above by using a spin coater to form a 2.5 μm thick coating film. This was dried in an oven at 100° C. for 1 minute. Further, the composition for forming an overcoat layer was applied on the atomic layer deposition film of the laminate described above by using a spin coater to form a 2.5 μm thick coating film. This was dried in an oven at 80° C. for 4 minutes, and then irradiated with ultraviolet radiation at 800 mJ/cm$^2$ to form an overcoat layer. Thus, a gas barrier film having a plastic substrate, an atomic layer deposition film, an adhesive layer, and an overcoat layer having a Martens hardness of 183 N/mm$^2$ was obtained.

Example D2

<Fabrication of Laminate (Gas Barrier Laminate) Having Atomic Layer Deposition Film>

A laminate (gas barrier laminate) having an atomic layer deposition film was fabricated in the same manner as in Example D 1. A composition for forming an adhesive layer was prepared in the same manner as in Example D1.

<Fabrication of Gas Barrier Film>

Preparation of a Composition for Forming an Overcoat Layer

As an organic polymer resin, an acrylic polymer (thermoplastic resin) having an OH value of 88 mg KOH/g, a glass transition temperature of 25° C., and a weight-average molecular weight (Mw) of 14,000 was used. Then, a curing agent of xylylene diisocyanate (XDI) type was added at a ratio of organic polymer resin mass:curing agent mass=2:1, and the mixture was diluted with ethyl acetate to a solid content of 24 mass % to thereby prepare a composition for forming an overcoat layer.

Fabrication of Gas Barrier Film

The composition for forming an adhesive layer obtained as above was applied on the atomic layer deposition film of the laminate described above by using a spin coater to form a 2.5 μm thick coating film. This was dried in an oven at 100° C. for 1 minute. Further, the composition for forming an overcoat layer was applied on the atomic layer deposition film of the laminate described above by using a spin coater to form a 2.5 μm thick coating film. This was dried in an oven at 80° C. for 4 minutes, and then aged at 50° C. for 24 hours to form an overcoat layer. Thus, a gas barrier film having a plastic substrate, an atomic layer deposition film, an adhesive layer, and an overcoat layer having a Martens hardness of 227 N/mm$^2$ was obtained.

Example D3

<Fabrication of Laminate (Gas Barrier Laminate) Having Atomic Layer Deposition Film>

A laminate (gas barrier laminate) having an atomic layer deposition film was fabricated in the same manner as in Example D1. A composition for forming an adhesive layer was prepared in the same manner as in Example D1.

Preparation of a Composition for Forming an Overcoat Layer

As an organic polymer resin, a polymer type acrylate resin (ultraviolet curable polymer) having a glass transition temperature of 110° C. and a weight-average molecular weight (Mw) of 20,000 was diluted with ethyl acetate to a solid content of 24 mass %. Further, IRGACURE 184 (manufactured by BASF) as an initiator was added at 2% of the mass of the above ultraviolet curable resin, and the mixture was stirred to prepare a composition for forming an overcoat layer.

Fabrication of Gas Barrier Film

The composition for forming an adhesive layer obtained as above was applied on the atomic layer deposition film of the laminate described above by using a spin coater to form a 2.5 μm thick coating film. This was dried in an oven at 100° C. for 1 minute. Further, the composition for forming an overcoat layer was applied on the atomic layer deposition film of the laminate described above by using a spin coater to form a 2.5 μm thick coating film. This was dried in an oven at 80° C. for 4 minutes, and then irradiated with ultraviolet radiation at 800 mJ/cm$^2$ to form an overcoat layer. Thus, a gas barrier film having a plastic substrate, an atomic layer deposition film, an adhesive layer, and an overcoat layer having a Martens hardness of 258 N/mm$^2$ was obtained.

Example D4

<Fabrication of Gas Barrier Laminate (First Laminate)>

A laminate having an atomic layer deposition film was fabricated in the same manner as in Example D2.

A composition for forming an adhesive layer was prepared in the same manner as in Example D2.

A composition for forming an overcoat layer was prepared in the same manner as in Example D2.

Fabrication of Second Laminate

A commercially available film for release and transfer (peeling force: 0.3 N/25 mm$^2$, thickness 38 μm) was used as a support. The composition for forming an overcoat layer obtained as above was applied at a thickness of 2.5 μm on a surface of the easily peelable layer of the support by using a spin coater. This was dried in an oven at 80° C. for 4 minutes. Further, the composition for forming an adhesive layer obtained as above was applied on the overcoat layer by using a spin coater to form a 2.5 μm thick coating film. This was dried in an oven at 100° C. for 1 minute. Thus, an overcoat laminate (second laminate) was formed.

<Fabrication of Gas Barrier Film>

The first laminate and the second laminate thus formed were laminated with the atomic layer deposition film and the adhesive layer facing each other. This was aged at 50° C. for 24 hours to cure the overcoat layer. After the overcoat layer was cured, the support was peeled off to transfer the adhesive layer and the overcoat layer onto the atomic layer deposition film. Thus, a gas barrier film having a plastic substrate, an atomic layer deposition film, an adhesive layer, and an overcoat layer having a Martens hardness of 227 N/mm² was obtained.

Example D5

<Fabrication of Gas Barrier Laminate (First Laminate)>

A laminate having an atomic layer deposition film was fabricated in the same manner as in Example D3.

A composition for forming an adhesive layer was prepared in the same manner as in Example D3. A composition for forming an overcoat layer was prepared in the same manner as in Example D3.
Fabrication of Second Laminate A commercially available film for release and transfer (peeling force: 0.3 N/25 mm², thickness 38 μm) was used as a support. The composition for forming an overcoat layer obtained as above was applied at a thickness of 2.5 μm on a surface of the easily peelable layer of the support by using a spin coater. This was dried in an oven at 80° C. for 4 minutes. Further, the composition for forming an adhesive layer obtained as above on the overcoat layer was applied on the atomic layer deposition film of the laminate described above by using a spin coater to form a 2.5 μm thick coating film. This was dried in an oven at 100° C. for 1 minute. Thus, an overcoat laminate (second laminate) was formed.
<Fabrication of Gas Barrier Film>

The first laminate and the second laminate thus formed were laminated with the atomic layer deposition film and the adhesive layer facing each other. The laminate was irradiated with ultraviolet radiation at 800 mJ/cm² to cure an overcoat layer. Then, the support was peeled off to transfer the adhesive layer and the overcoat layer onto the atomic layer deposition film. Thus, a gas barrier film having a plastic substrate, an atomic layer deposition film, an adhesive layer, and an overcoat layer having a Martens hardness of 258 N/mm² was obtained.

Example D6

A 1st solution and a 2nd solution described below are mixed at a compounding ratio of 60/40 (mass ratio) to prepare a coating solution.

1st solution: Hydrolyzed solution of a solid content of 3 mass % (equivalent to $SiO_2$) obtained by adding 89.6 g of hydrochloric acid (0.1 N) to 10.4 g of tetraethoxysilane, and stirring for 30 minutes for hydrolysis 2nd solution: Solution of 3 mass % of polyvinyl alcohol in a water/isopropyl alcohol solution=90:10 (mass ratio)

A gas barrier film was obtained under the same conditions and by the same method as those of Example D1 except that the first laminate was formed by applying and drying the above coating solution on a film, and then forming a sputtered film by sputtering, instead of the atomic layer deposition film of Example D1.

In the method of forming a sputtered film, a PET film was first set in a chamber of a magnetron sputtering apparatus. 200 sccm of argon gas (Ar) and 30 sccm of oxygen gas ($O_2$) were introduced into the chamber, and a pressure in the chamber was adjusted to 0.2 Pa. A Si target was used as a target, and reactive sputtering was performed at a power density of 3 W/cm².

As a result, a gas barrier film having a plastic substrate, a 90 nm thick sputtered film formed of a silicon oxide film, an adhesive layer, and an overcoat layer having a Martens hardness of 183 N/mm² was obtained.

Comparative Example D1

A laminate having an atomic layer deposition film was formed under the same conditions and by the same method as those of Example D2.

A composition for forming an overcoat layer was prepared in the same manner as in Example D2.
Fabrication of Gas Barrier Film The composition for forming an overcoat layer obtained as above was applied on the atomic layer deposition film of the laminate described above by using a spin coater to form a 2.5 μm thick coating film. This was dried in an oven at 80° C. for 4 minutes, and then aged at 50° C. for 24 hours to form an overcoat layer. Thus, a gas barrier film having a plastic substrate, an atomic layer deposition film, and an overcoat layer having a Martens hardness of 227 N/mm² was obtained.

Comparative Example D2

A laminate having an atomic layer deposition film was formed under the same conditions and by the same method as those of Example D1.

A composition for forming an overcoat layer was prepared in the same manner as in Example D1.

Comparative Example D3

A laminate having a sputtered film was formed under the same conditions and by the same method as those of Example D6.

A composition for forming an overcoat layer was prepared in the same manner as in Example D1.
Fabrication of Second Laminate A commercially available film for release and transfer (peeling force: 0.3 N/25 mm², thickness 38 μm) was used as a support. The composition for forming an overcoat layer obtained as above was applied at a thickness of 2.5 μm on a surface of the easily peelable layer of the support by using a bar coater. This was dried in an oven at 80° C. for 4 minutes.
<Fabrication of Gas Barrier Film>

The first laminate and the second laminate thus formed were laminated with the atomic layer deposition film and the overcoat layer facing each other. The laminate was irradiated with ultraviolet radiation at 800 mJ/cm² to cure an overcoat layer. Then, the support was peeled off to transfer the adhesive layer and the overcoat layer onto the atomic layer deposition film. Thus, a gas barrier film having a plastic substrate, an atomic layer deposition film, an adhesive layer, and an overcoat layer having a Martens hardness of 183 N/mm² was obtained.

For the respective gas barrier films thus obtained, the Martens hardness and the water vapor transmission rate were measured in the same manner as in Example A. Table 4 shows the results.

TABLE 4

| | OC layer | | Adhesive layer | | | | OC layer | | | Water vapor transmission rate [g/m² · day] | |
|---|---|---|---|---|---|---|---|---|---|---|---|
| | Barrier layer | formation method | Adhesive layer | Film thickness (μm) | Martens hardness (N/mm²) | Configuration | Film thickness (μm) | Curing method | Martens hardness (N/mm²) | Initial | After compression |
| Example D1 | Atomic layer deposition film | Spin coater | Provided | 2.5 | 8.7 | Thermoplastic resin + multifunctional ultraviolet curable resin | 2.5 | UV curing | 183 | $5 \times 10^{-4}$ | $5 \times 10^{-4}$ |
| Example D2 | Atomic layer deposition film | Spin coater | Provided | 2.5 | 8.7 | Thermoplastic resin + curing agent (XDI) | 2.5 | Heat curing | 227 | $5 \times 10^{-4}$ | $5 \times 10^{-4}$ |
| Example D3 | Atomic layer deposition film | Spin coater | Provided | 2.5 | 8.7 | Ultraviolet curable polymer (polymer acrylate) | 2.5 | UV curing | 258 | $5 \times 10^{-4}$ | $6 \times 10^{-4}$ |
| Example D4 | Atomic layer deposition film | Transfer | Provided | 2.5 | 8.7 | Thermoplastic resin + curing agent (XDI) | 2.5 | Heat curing | 227 | $5 \times 10^{-4}$ | $8 \times 10^{-4}$ |
| Example D5 | Atomic layer deposition film | Transfer | Provided | 2.5 | 8.7 | Ultraviolet curable polymer (polymer acrylate) | 2.5 | UV curing | 258 | $4 \times 10^{-4}$ | $7 \times 10^{-4}$ |
| Example D6 | Sputtered film | Spin coater | Provided | 2.5 | 8.7 | Thermoplastic resin + multifunctional ultraviolet curable resin | 2.5 | UV curing | 183 | $4 \times 10^{-3}$ | $5 \times 10^{-3}$ |
| Comparative example D1 | Atomic layer deposition film | Spin coater | Not provided | 2.5 | — | Thermoplastic resin + curing agent (XDI) | 2.5 | Heat curing | 227 | $4 \times 10^{-4}$ | $4 \times 10^{-3}$ |
| Comparative example D2 | Atomic layer deposition film | Transfer | Not provided | 2.5 | — | Thermoplastic resin + multifunctional ultraviolet curable resin | 2.5 | UV curing | 183 | $5 \times 10^{-4}$ | $3 \times 10^{-3}$ |
| Comparative example D3 | Sputtered film | Spin coater | Not provided | 2.5 | — | Thermoplastic resin + multifunctional ultraviolet curable resin | 2.5 | UV curing | 183 | $4 \times 10^{-3}$ | $7 \times 10^{-2}$ |

As seen from Table 4, for the gas barrier films of Examples D1 to B3, and D6, in which the adhesive layer was formed by coating using a spin coater, almost no change was found in the water vapor transmission rate even after application of an external mechanical stress compared with immediately after formation of the films, in spite of having a high Martens hardness, which was significantly higher than 95 N/mm². Further, for the gas barrier films of Examples D4 and D5, in which the adhesive layer was provided by transfer, almost no change was found in the water vapor transmission rate even after application of an external mechanical stress compared with immediately after formation of the films, in spite of having a high Martens hardness, which was significantly higher than 95 N/mm².

On the other hand, for the gas barrier films of Comparative Examples D1 and D2, in which no adhesive layer was provided, the water vapor transmission rates of the films formed by coating or transfer were decreased from $10^{-4}$ g/m²·day to $10^{-3}$ g/m²·day. For the Comparative Example D3 as well, the water vapor transmission rate was decreased from $10^{-3}$ g/m²·day to $10^{-2}$ g/m²·day. That is, it is found that the function of the overcoat layer of imparting high barrier properties is maintained by providing the adhesive layer even if the overcoat layer has high Martens hardness.

The present invention is not limited to the embodiments described above, but may be modified in various ways when implemented, without departing from the spirit of the present invention. The embodiments may be appropriately combined in implementation. In this case, the combinations each exert the advantageous effects accordingly. The embodiments described above include various inventions. Therefore, various inventions can be extracted from combinations selected from a plurality of constituent elements disclosed herein. For example, even if some constituent elements are eliminated from all the constituent elements disclosed in the embodiments, the configuration with these constituent elements eliminated can be understood to be within the scope of the invention as long as the issues can be solved and the advantageous effects can be achieved.

INDUSTRIAL APPLICABILITY

The present invention is applicable to gas barrier films and methods for producing the same, and specifically to electronics for liquid crystal displays, organic EL displays, organic EL lightings, organic solar cells, semiconductor wafers, and the like, packaging films for pharmaceuticals and food products, packaging films for precision parts, and the like.

REFERENCE SIGNS LIST

1 . . . Plastic substrate; 2 . . . Barrier layer; 3 . . . Overcoat layer; 4 . . . Support; 5 . . . Overcoat layer (uncured); 6 . . . Adhesive layer; 10 . . . Gas barrier film; 11 . . . Gas barrier laminate (first laminate); 12 . . . Overcoat laminate (second laminate); 20 . . . Film deposition apparatus for atomic layer deposition film; 21 . . . First vacuum chamber; 22 . . . Second vacuum chamber; 23 . . . Third vacuum chamber; 4 . . . Transport mechanism; 25 . . . Unwinding section; 26 . . . Take-up section; 27 . . . Vacuum pump; 28 . . . Roll (thermal transfer roll); 29 . . . Curing processing section; 30 . . . Heat; 31 . . . Ionizing radiation; 101 . . . First unwinding roll; 102 . . . First take-up roll; 103 . . . Second unwinding roll; 104 . . . Second take-up roll.

What is claimed is:

1. A gas barrier film, comprising:
a plastic substrate;
a barrier layer containing an inorganic substance, the barrier layer being disposed on the plastic substrate; and
an overcoat layer disposed on the barrier layer, wherein the overcoat layer consists of a thermoplastic resin, and has a glass transition temperature in a range of 20° C. or more and 100° C. or less, wherein the overcoat layer is an outermost layer of the gas barrier film, wherein the thermoplastic resin comprises a polyol having a hydroxyl value of 10 mg KOH/g or more and 250 mg KOH/g or less, wherein the overcoat layer has a Martens hardness from 10 N/mm$^2$ to 90 N/mm$^2$, wherein the barrier layer consists of titanium oxide or silicon oxide, and wherein the overcoat layer has a thickness in a range of 0.1 μm or more and 3.0 μm or less.

2. The gas barrier film of claim 1, wherein the barrier layer is any one of an atomic layer deposition film, a physical vapor deposition film, and a chemical vapor deposition film.

3. The gas barrier film of claim 1, wherein the plastic substrate is the only substrate of the gas barrier film.

4. The gas barrier film of claim 1, wherein the barrier layer is direct contact with the plastic substrate and the overcoat layer is in direct contact with the barrier layer.

5. The gas barrier film of claim 1, further comprising an adhesive layer between the barrier layer and the overcoat layer, wherein the barrier layer is direct contact with the plastic substrate, the adhesive layer is in direct contact with the barrier layer, and the overcoat layer is in direct contact with the adhesive layer.

6. The gas barrier film of claim 1, wherein the barrier layer is an atomic layer deposited film.

7. The gas barrier film of claim 6, wherein the barrier layer consists of titanium oxide.

8. The gas barrier film of claim 1, wherein the barrier layer is a sputtered film.

9. The gas barrier film of claim 8, wherein the barrier layer consists of silicon oxide.

* * * * *